(12) United States Patent
Lee et al.

(10) Patent No.: US 10,955,360 B2
(45) Date of Patent: Mar. 23, 2021

(54) STRUCTURED ILLUMINATION-BASED INSPECTION APPARATUS AND INSPECTION METHOD, AND SEMICONDUCTOR DEVICE FABRICATION METHOD INCLUDING STRUCTURED ILLUMINATION-BASED INSPECTION METHOD

(71) Applicant: SAMSUNG ELECTRONICS CO., LTD., Suwon-si (KR)

(72) Inventors: Myung-jun Lee, Seongnam-si (KR); Ken Ozawa, Kanagawa (JP); Wook-rae Kim, Suwon-si (KR); Gwang-sik Park, Suwon-si (KR); Ji-hoon Kang, Seongnam-si (KR); Kwang-soo Kim, Pyeongtaek-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/285,548

(22) Filed: Feb. 26, 2019

(65) Prior Publication Data

US 2020/0064276 A1     Feb. 27, 2020

(30) Foreign Application Priority Data

Aug. 22, 2018    (KR) ........................ 10-2018-0098095

(51) Int. Cl.
*G06T 7/00*      (2017.01)
*G01N 21/95*    (2006.01)
(Continued)

(52) U.S. Cl.
CPC ........... *G01N 21/9501* (2013.01); *G06T 5/50* (2013.01); *G06T 7/0004* (2013.01);
(Continued)

(58) Field of Classification Search
CPC ............. G06T 5/50; G06T 2207/10152; G06T 2207/30148; G06T 2207/20216;
(Continued)

(56) References Cited

U.S. PATENT DOCUMENTS

| 4,963,724 A | 10/1990 | Neumann |
| 6,762,839 B2 | 7/2004 | Zeylikovich et al. |

(Continued)

FOREIGN PATENT DOCUMENTS

| JP | 2003-161889 | 6/2003 |
| JP | 5865738 | 2/2016 |
| KR | 10-2016-0091380 | 8/2016 |

OTHER PUBLICATIONS

M.G.L. Gustafsson, "Surpassing the lateral resolution limit by a factor Of two using structured illumination microscopy", Journal of Microscopy, vol. 198, Pt. 2, May 2000, pp. 82-87.

(Continued)

*Primary Examiner* — Zhihan Zhou
(74) *Attorney, Agent, or Firm* — F. Chau & Associates, LLC

(57) ABSTRACT

Systems and methods related to a structured illumination (SI)-based inspection apparatus are described. The SI-based inspection apparatus may be capable of accurately inspecting an inspection object in real time with high resolution, while reducing the loss of light. Also described are an inspection method, and a semiconductor device fabrication method including the SI-based inspection method. The inspection apparatus may include a light source configured to generate and output a light beam, a phase shifting grating (PSG) configured to convert the light beam from the light source into the SI, a beam splitter configured to cause the SI to be incident on an inspection object and output a reflected beam from the inspection object, a stage capable of moving the inspection object and on which the inspection object is (Continued)

arranged, and a time-delayed integration (TDI) camera configured to capture images of the inspection object by detecting the reflected beam.

12 Claims, 21 Drawing Sheets

(51) Int. Cl.
*G06T 5/50* (2006.01)
*H04N 5/372* (2011.01)
*H01L 21/66* (2006.01)
*H01L 21/67* (2006.01)

(52) U.S. Cl.
CPC ........ *H01L 21/67288* (2013.01); *H01L 22/12* (2013.01); *H04N 5/37206* (2013.01); *G06T 2207/10152* (2013.01); *G06T 2207/20216* (2013.01); *G06T 2207/30148* (2013.01)

(58) Field of Classification Search
CPC ... G06T 7/0004; H04N 5/37206; H01L 22/12; H01L 21/67288; G01N 21/9501
See application file for complete search history.

(56) References Cited

U.S. PATENT DOCUMENTS

| | | | |
|---|---|---|---|
| 7,599,051 B1 | 10/2009 | Labovitz et al. | |
| 7,911,600 B2 | 3/2011 | Terasawa et al. | |
| 8,629,407 B2 | 1/2014 | Lai et al. | |
| 9,513,228 B2 | 12/2016 | Shibata et al. | |
| 2004/0245439 A1* | 12/2004 | Shaver | G03F 7/70308 250/225 |
| 2006/0199084 A1* | 9/2006 | Word | G03F 1/29 430/5 |
| 2006/0256313 A1* | 11/2006 | Renner | G03F 7/70125 355/67 |
| 2007/0053576 A1* | 3/2007 | Neureuther | G03F 7/706 382/144 |
| 2008/0030708 A1* | 2/2008 | Hansen | G03F 7/70891 355/71 |
| 2009/0104542 A1* | 4/2009 | Nyhus | G03F 1/34 430/5 |
| 2010/0260409 A1* | 10/2010 | Ben-Levy | G01B 11/2518 382/141 |

OTHER PUBLICATIONS

S. Hayashi, et al., "Ultrafast superresolution fluorescence imaging with spinning disk confocal microscope optics", Molecular Biology of the Cell, vol. 26, pp. 1743-1751, 2015.

* cited by examiner

FIG. 2C
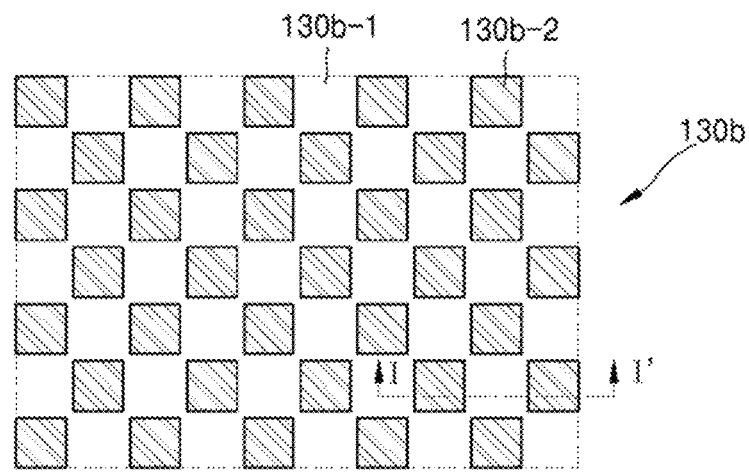
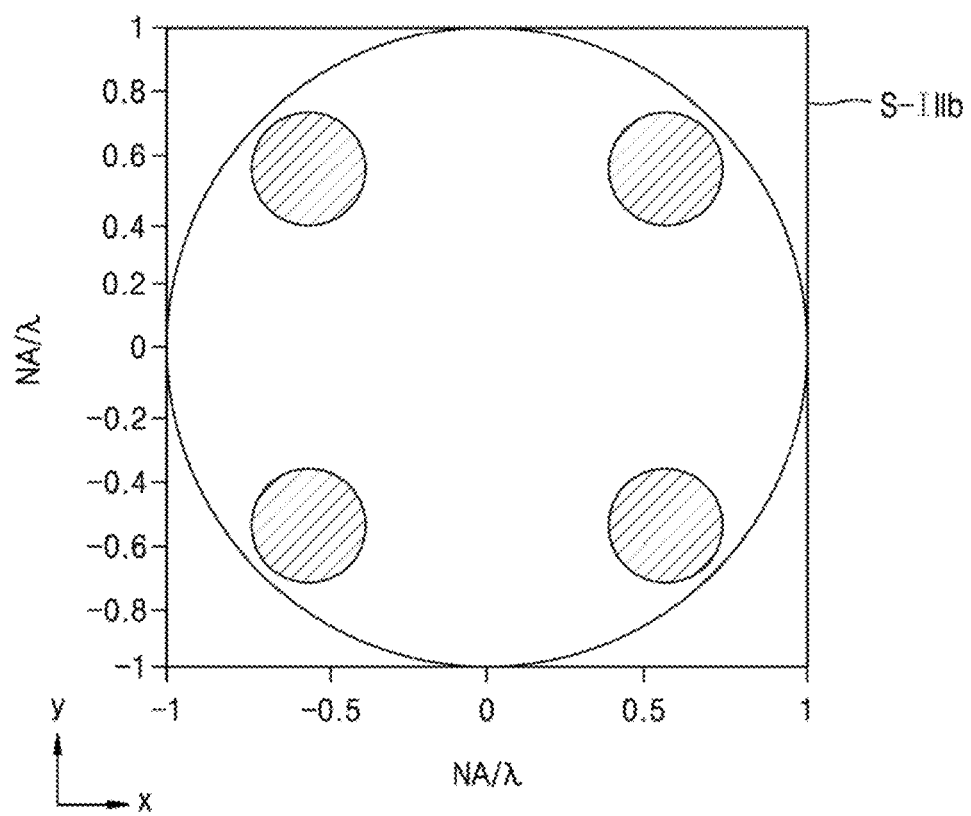

FIG. 2E
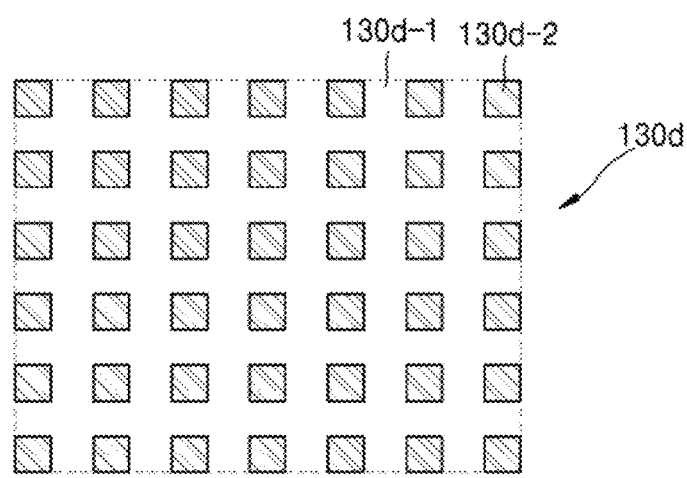
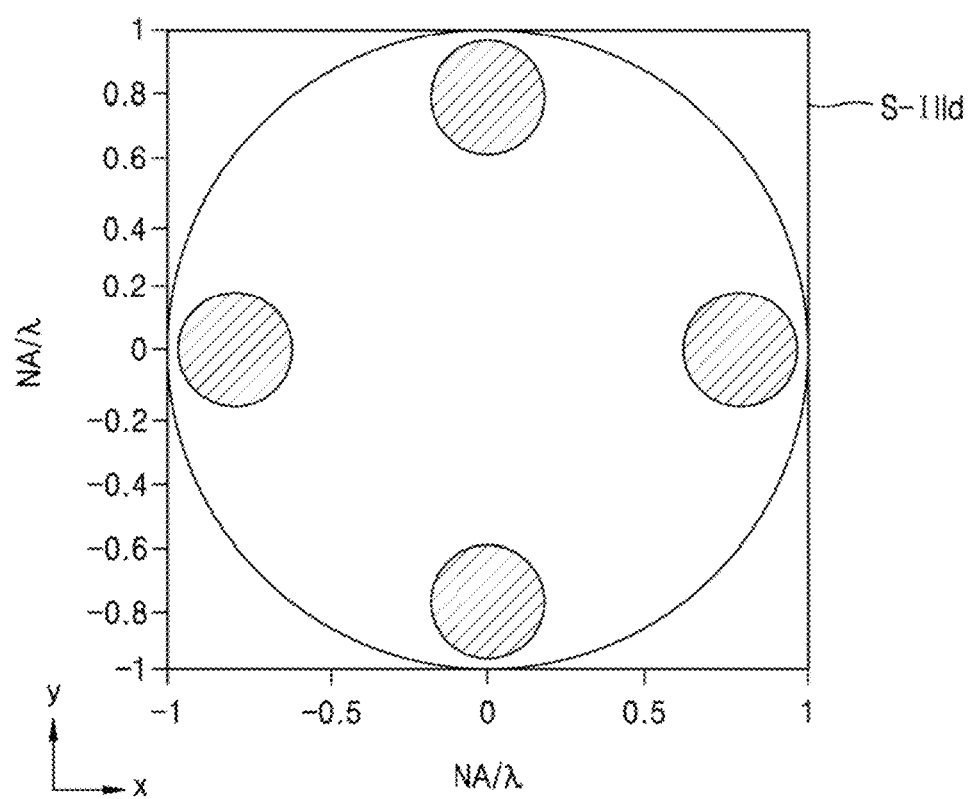

FIG. 3A
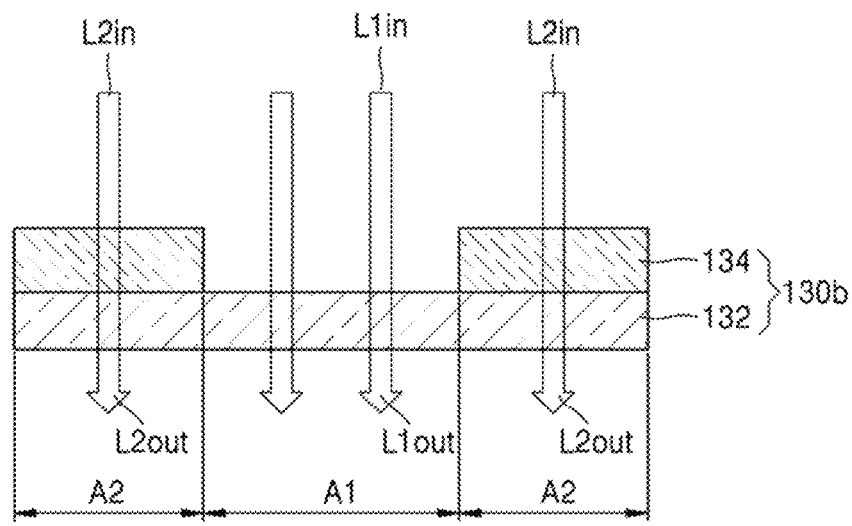
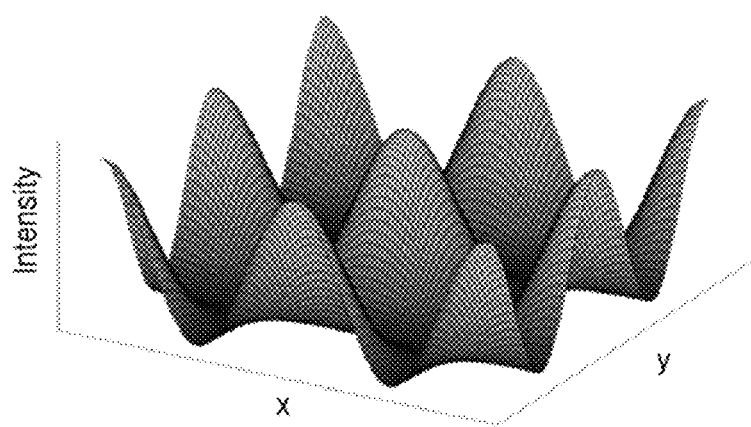

FIG. 3B
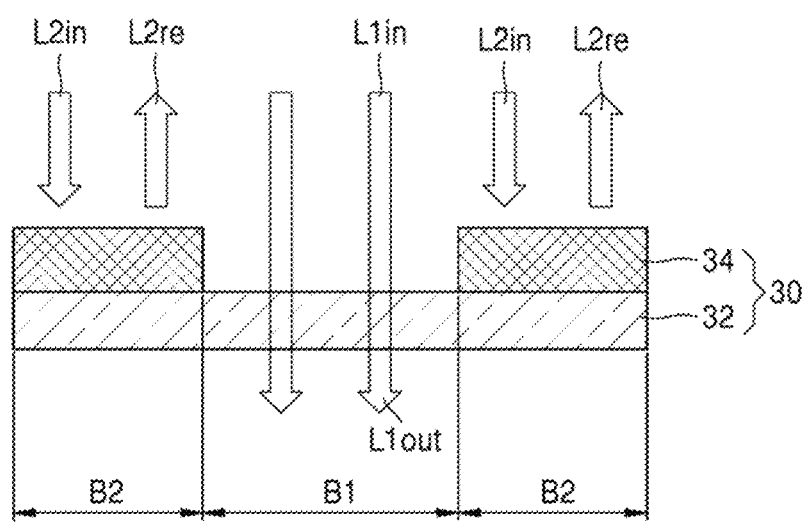
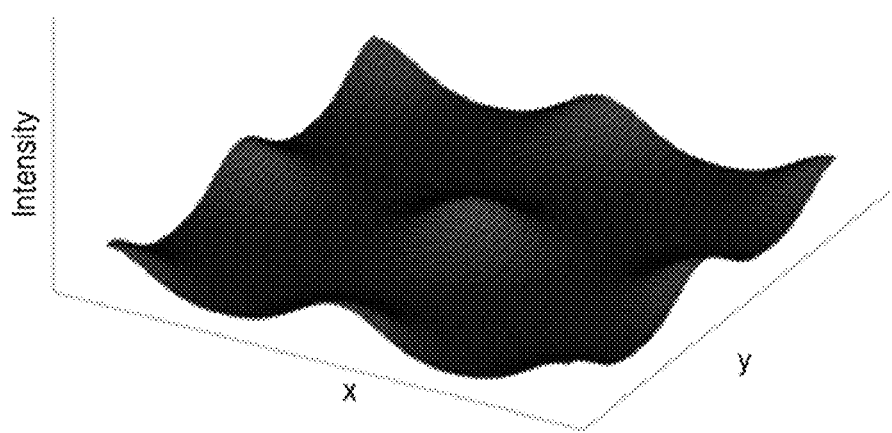

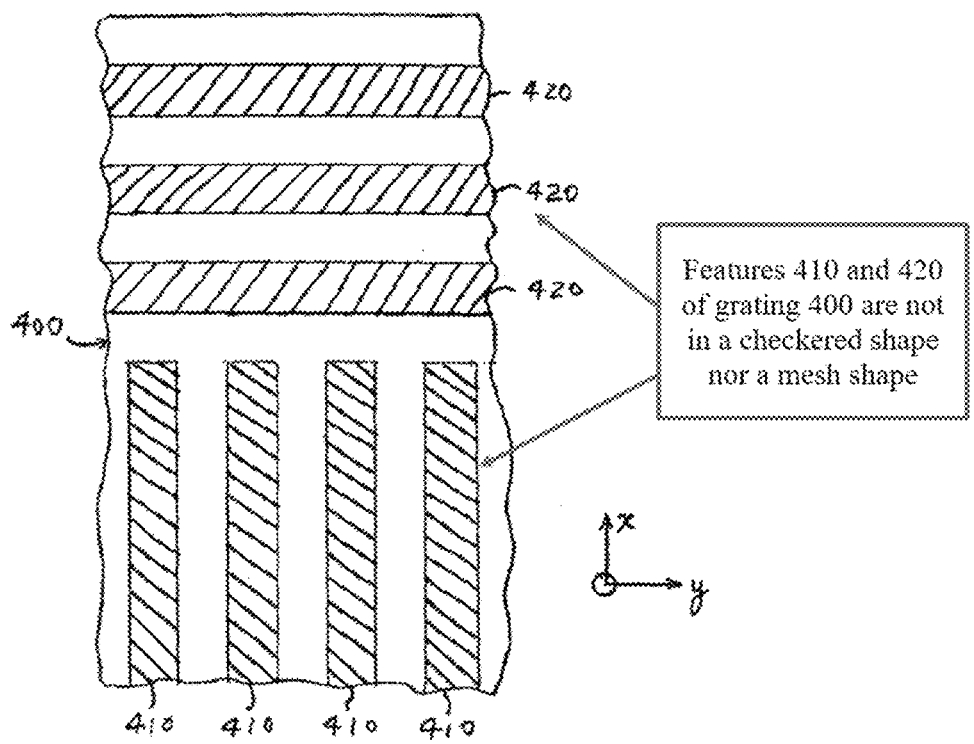
FIG. 4a of Shaver
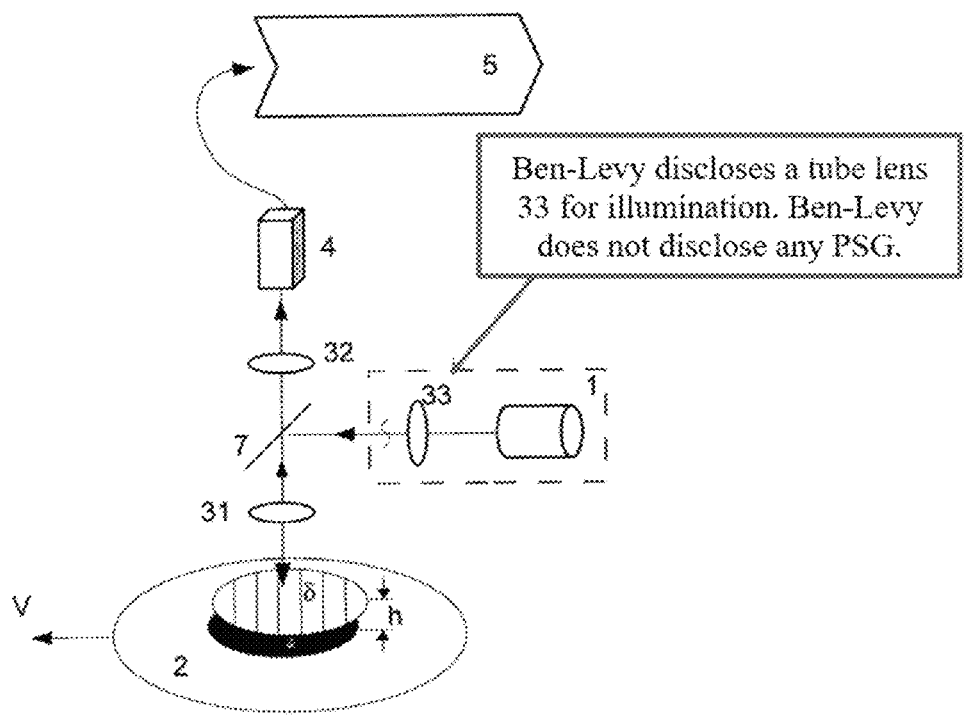
FIG. 4 of Ben-Levy

FIG. 5A
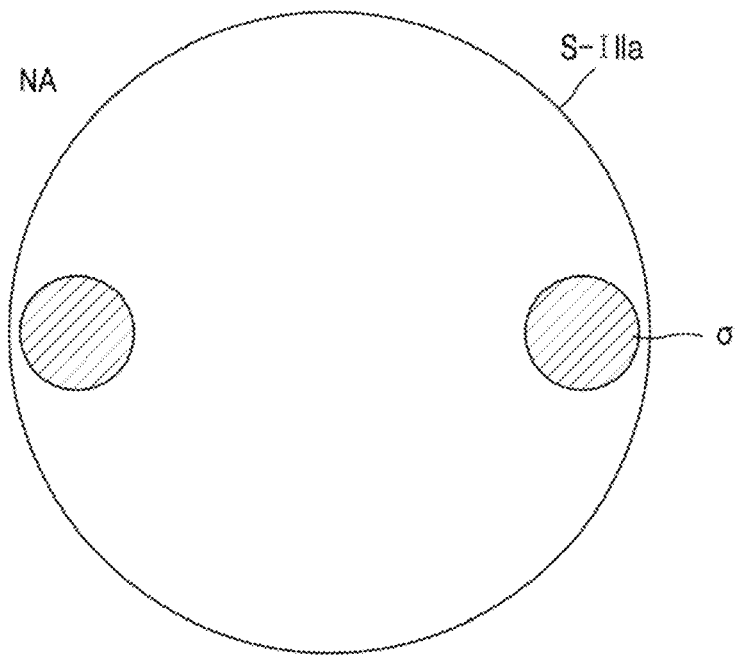
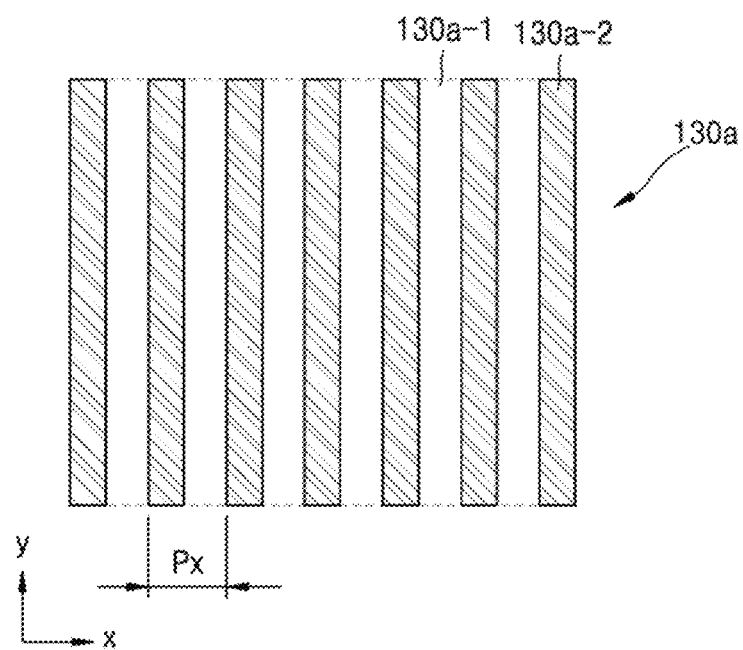

FIG. 5B
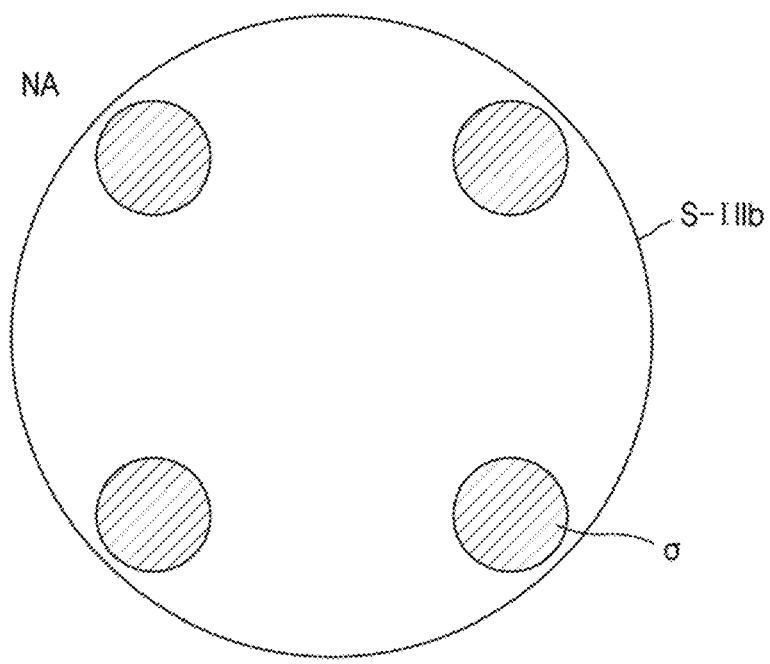
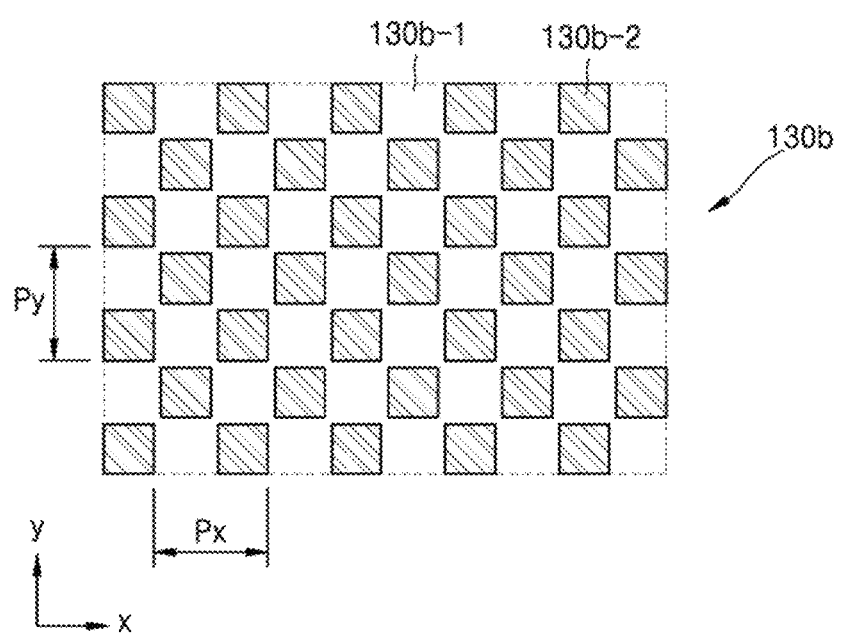

STRUCTURED ILLUMINATION-BASED INSPECTION APPARATUS AND INSPECTION METHOD, AND SEMICONDUCTOR DEVICE FABRICATION METHOD INCLUDING STRUCTURED ILLUMINATION-BASED INSPECTION METHOD

CROSS-REFERENCE TO RELATED APPLICATION

This application claims the benefit of Korean Patent Application No. 10-2018-0098095, filed on Aug. 22, 2018, in the Korean Intellectual Property Office, the disclosure of which is incorporated by reference herein.

BACKGROUND

1. Technical Field

The inventive concept relates to an inspection apparatus and inspection method, and more particularly, to a structured illumination (SI)-based inspection apparatus and inspection method.

2. Related Art

As the design rule in a semiconductor manufacturing process decreases, smaller abnormalities on the surface of a wafer may become relevant. That is, the size of potential defects may decrease. As a result, it may become more difficult to detect these defects. In some cases, increasing the optical resolution of an inspection apparatus may enable the apparatus to detect smaller defects. For example, the optical resolution of an inspection apparatus may be improved by increasing the numerical aperture (NA of an objective lens. However, the effectiveness of a high NA method may be limited based on the wavelength of the light used for inspection.

Another method of improving optical resolution may include using structured illumination (SI). However, SI approaches may also be limited in that they may be difficult to apply to certain optical systems, they may result in a significant loss of light, and they may depend on post image processing.

SUMMARY

The inventive concept provides a structured illumination (SI)-based inspection apparatus and inspection method for accurately inspecting an object in real time with high resolution while reducing light loss, and a semiconductor device fabrication method based on the inspection method.

According to an aspect of the inventive concept, there is provided an inspection apparatus based on structured illumination (SI), the inspection apparatus including: a light source configured to generate and output a light beam, a phase shift grating (PSG) configured to convert the light beam from the light source into the SI, a beam splitter configured to cause the SI to be incident on an inspection object and to output a reflected beam from the inspection object, a stage configured to receive and move the inspection object, and a time-delayed integration (TDI) camera configured to capture images of the inspection object by detecting the reflected beam.

According to another aspect of the inventive concept, there is provided an inspection apparatus based on SI, the inspection apparatus including: a light source configured to generate and output a light beam, a PSG configured to transmit substantially all of the light beam from the light source and to generate the SI, a beam splitter configured to cause the SI to be incident on an inspection object and to output a reflected beam from the inspection object, a stage configured to receive and move the inspection object, and a TDI camera configured to detect the reflected beam and to capture images of the inspection object, wherein, the inspection apparatus is configured to inspect the inspection object in real time by capturing images of the inspection object using the TDI camera while the inspection object is being moved.

According to another aspect of the inventive concept, there is provided an inspection method based on SI, the inspection method including: generating and outputting a light beam, wherein the generating and outputting is performed by a light source, generating the SI in a PSG by transmitting substantially all of the light beam from the light source, causing, via a beam splitter, the SI to be incident on an inspection object, outputting a reflected beam from the inspection object, and capturing, in a TDI camera, images of the inspection object by detecting the reflected beam.

According to another aspect of the inventive concept, there is provided a semiconductor device fabrication method including: generating and outputting, by a light source, light beam; generating the SI, in a PSG, by transmitting substantially all of the light beams from the light source; causing, in a beam splitter, the SI to be incident on an inspection object and outputting a reflected beam from the inspection object; capturing, in a time-delayed integration TDI camera, images of the inspection object by detecting the reflected beam; and performing, when there is no defect in the inspection object, a semiconductor process on the inspection object.

According to another aspect of the inventive concept, there is provided a method of inspecting an inspection object, comprising: forming a light beam into an SI pattern using a PSG of an illumination optical system; reflecting the light beam onto the inspection object using an imaging optical system distinct from the illumination optical system; capturing a first image of the inspection object by detecting the reflected beam using a first sensor region of a line scan camera while the inspection object is located at a first position; capturing a second image of the inspection object by detecting the reflected beam using a second sensor region of the line scan camera while the inspection object is located at a second position different from the first position; integrating the first image and the second image by averaging a phase of the first image and a phase of the second image to produce an integrated image; and determining whether the inspection object includes a defect in real time based on the integrated image.

BRIEF DESCRIPTION OF THE DRAWINGS

Embodiments of the inventive concept will be more clearly understood from the following detailed description taken in conjunction with the accompanying drawings in which:

FIGS. 2A through 2E are conceptual diagrams illustrating various types of phase shifting gratings (PSGs) used in the SI-based inspection apparatus of FIG. 1 according to embodiments of the present disclosure;

FIG. 3A illustrates a cross-sectional view of the PSG of FIG. 2C taken along line I-1' and an intensity graph of illumination corresponding thereto;

FIG. 3B illustrates a cross-sectional view of a general binary grating and an intensity graph of illumination corresponding thereto according to embodiments of the present disclosure;

FIGS. 4A through 4E illustrate various types of PSGs and their corresponding SIs and amplitude graphs according to embodiments of the present disclosure;

FIGS. 5A and 5B are conceptual diagrams for designing of a dipole PSG and a quadrupole PSG, respectively, according to embodiments of the present disclosure;

DETAILED DESCRIPTION OF THE EMBODIMENTS

Figure 1:
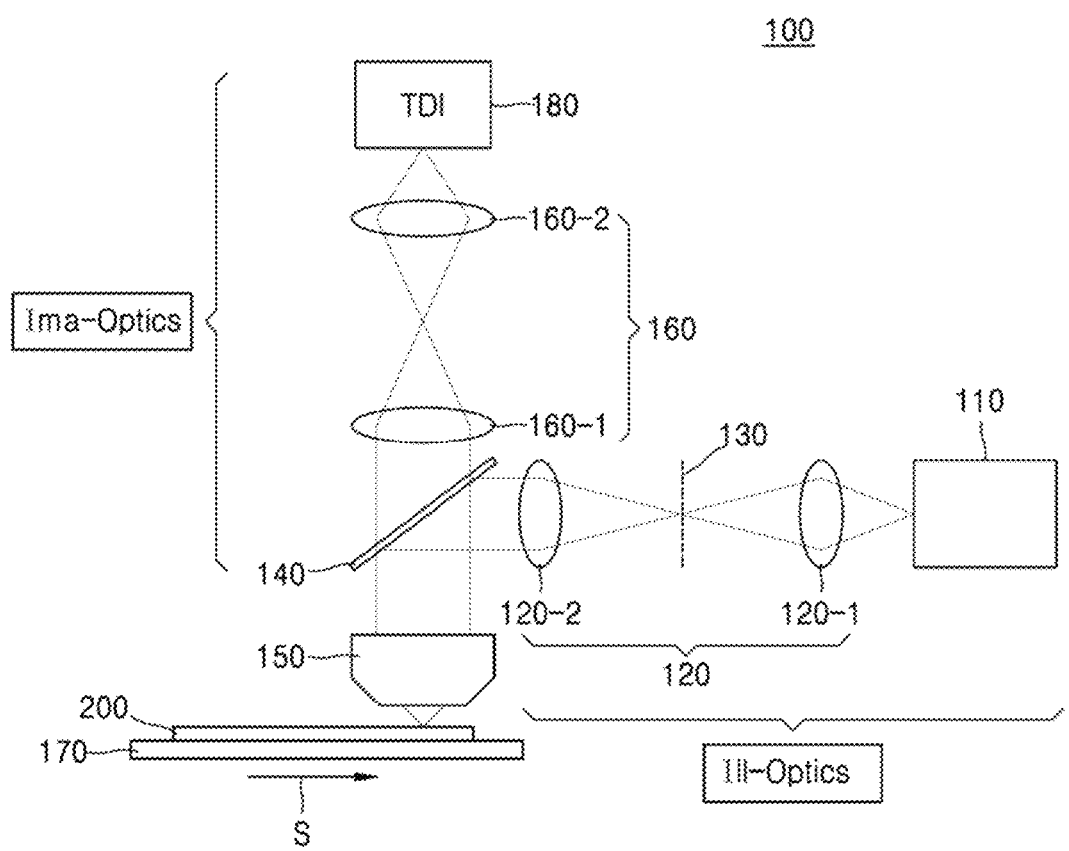
FIG. 1 is a conceptual diagram schematically illustrating a structured illumination (SI)-based inspection apparatus according to embodiments of the present disclosure.

Hereinafter, embodiments of the present inventive concept will be described in detail with reference to the accompanying drawings. Identical reference numerals are used for the same constituent elements in the drawings, and a duplicate description thereof are omitted.

The present disclosure describes a method and apparatus for obtaining high resolution images using structured illumination technology. In particular, the apparatus may be configured to perform a scanning method inspection using a time-delayed integration (TDI) camera. The apparatus may also reduce the loss of light by using a two-dimensional (2D) orthogonal chromeless phase shift grating. The method and apparatus described herein may enable object inspection in real time by mitigating the need for post image processing.

FIG. 1 is a conceptual diagram schematically illustrating a structured illumination (SI)-based inspection apparatus 100 according to embodiments of the present disclosure.

Referring to FIG. 1, the SI-based inspection apparatus 100 according to the present embodiment may include a light source 110, a phase shift grating (PSG) 130, a beam splitter 140, an object lens 150, a stage 170, and a time-delayed integration (TDI) camera 180.

The light source 110 may include a laser device which generates and outputs a laser beam. The laser beam from the light source 110 may be a pulse laser. For example, the light beam may be a low power pulse (LPP) laser. The light beam of the light source 110 is not limited to the pulse laser. For example, according to the embodiment, the light beam of the light source 110 may be a continuous wave laser.

The light source 110 may generate and output a beam of various wavelengths. For example, the light source 110 may generate and output light beams of wavelengths of about 248 nm (KrF), about 193 nm (ArF), or about 157 nm ($F_2$). However, the light beam of the light source 110 is not limited to light beams of these wavelengths. For example, the light source 110 may generate and output an extreme ultraviolet (EUV) beam corresponding to several tens of nanometers.

The PSG 130 may convert the light beam of the light source 110 into an SI using diffraction and phase shift phenomena. For example, the PSG 130 may convert the light beam of the light source 110 to dipole illumination or quadrupole illumination. The SI generated by the PSG 130 is not limited to dipole illumination and quadrupole illumination. For example, an octapole (8-pole) or any other suitable illumination may be generated by the PSG 130. The SI may improve the resolution of images. This may be because angles of incidence of neighboring beams in the SI are greater than those of general illumination and accordingly, the resolution of the images may be improved due to reduced limit resolution.

In some examples of the SI-based inspection apparatus 100, the PSG 130 may not include a metal such as chromium. For example, the PSG 130 may be a chromeless PSG. Accordingly, the PSG 130 may transmit substantially all of the light beams from the light source 110. However, since a speed at which the light beam passes through the PSG 130 per region varies, a phase shift may occur. In addition, since the light beam is diffracted while penetrating each region of the PSG 130, an SI may be formed. A cross-section, a grating configuration, and the SI of the PSG 130 are described in more detail in the description given with reference to FIGS. 2A through 6B.

The beam splitter 140 may cause the SI formed through the PSG 130 to be incident on an inspection object 200 and output a reflected light beam from the inspection object 200 toward the TDI camera 180. For example, the beam splitter 140 may cause the SI from the PSG 130 to be incident on the inspection object 200 by transmitting or reflecting the SI, and may cause the light beam reflected from the inspection object 200 to travel toward the TDI camera 180 by further reflecting or transmitting the reflected light beam.

The object lens 150 may cause the SI from the beam splitter 140 to be collected and be incident on the inspection object 200. In addition, the object lens 150 may cause the reflected light beam from the inspection object 200 to be incident on the beam splitter 140.

The inspection object 200 may be arranged on the stage 170. The stage 170 may move the inspection object 200 through linear movements in an x direction, a y direction, and a z direction. Accordingly, the stage 170 may also be referred to as an x-y-z stage. According to various embodiments, the stage 170 may move the inspection object 200 through linear and/or rotational movements.

As the stage 170 moves in a scanning direction S as indicated by an arrow, the inspection object 200 may be moved in the scanning direction S. Accordingly, the TDI camera 180 may capture images of the inspection object 200 while the inspection object 200 is moved in the scanning direction S. The image capturing of the inspection object 200 by the TDI camera 180 is described in more detail with reference to FIGS. 6A through 6C.

The inspection object 200 may comprise various elements including a wafer, a semiconductor package, a semiconductor chip, a display panel, etc. For example, in the SI-based inspection apparatus 100 of the present embodiment, the inspection object 200 may be a wafer including a plurality of semiconductor elements. For reference, the SI-based inspection apparatus 100 of the present embodiment may inspect the inspection object 200 to detect defects thereof. The defects may be, for example, fine particles on the inspection object 200 and scratches formed on the inspection object 200. However, the defects are not limited to fine particles or scratches. In addition, the defects may not indicate all particles or all scratches, but may indicate particles or scratches of sizes outside a tolerance. Hereinafter, the defects of the inspection object 200 may be understood according to the above description.

The defects may cause the inspection object 200 to be of poor quality in subsequent processes. For example, when the inspection object 200 is a wafer, in subsequent semiconductor processes of the wafer, defects may cause the semiconductor elements in the wafer to be of poor quality. By detecting the defects of the inspection object 200 and removing the defects in advance may be possible to prevent the inspection object 200 from having a poor quality. In another example, by discarding the inspection object 200 based on detecting one or more defects, it may be possible to omit subsequent processes of the inspection object 200 that will result in an unsuitable product. Furthermore, it may be possible to identify methods of preventing the occurrence of the defects by analyzing the causes of the defects.

The TDI camera 180 may be a camera that includes a plurality of pixels (which, in some examples, may be formed in a line shape). The TDI camera 180 may obtain composite images by photographing an object at certain time intervals, and overlapping and integrating the images obtained at each interval. The TDI camera 180 may integrate images in such a manner that phases of the images are accumulated and averaged. Accordingly, the SI-based inspection apparatus 100 of the present embodiment may reduce or eliminate the need to perform post image processing (e.g., in which the phases of the images are taken into consideration and combined). The TDI camera 180 is described in more detail with reference to FIGS. 6A through 6C.

The SI-based inspection apparatus 100 of the present embodiment may include an illumination relay lens unit 120 including at least two relay lenses (120-1 and 120-2) for transmitting the light beam from the light source 110 to the inspection object 200. In addition, the SI-based inspection apparatus 100 may include an imaging relay lens unit 160 including at least two relay lenses (160-1 and 160-2) for transmitting the reflected light beam from the inspection object 200 to the TDI camera 180. In addition, the SI-based inspection apparatus 100 of the present embodiment may further include a collimation lens, versatile filters, a plurality of mirrors, and the like, which are omitted and not illustrated.

The SI-based inspection apparatus 100 of the present embodiment may greatly improve the resolution of an image while reducing loss of light by generating the SI through the PSG 130 and using the generated SI for capturing images of the inspection object 200. Accordingly, the SI-based inspection apparatus 100 of the present embodiment may use a light source of relatively low illuminance and in addition, may acquire a high-resolution image of the inspection object 200 for precise inspection of the defects of the inspection object 200.

The SI-based inspection apparatus 100 of the present embodiment may perform high-speed photographing of the inspection object 200 and may reduce or eliminate the need to perform the post image processing. For example, the SI-based inspection apparatus 100 may mitigate the need for integrating the images considering phases of the images by capturing images of the inspection object 200 using the TDI camera 180. Thus, the SI-based inspection apparatus 100 may inspect the inspection object 200 in real time and significantly improve an inspection speed for inspecting an inspection object 200.

The SI-based inspection apparatus 100 of the present embodiment may arrange the PSG 130 in an illumination optical system Ill-Optics by using the TDI camera 180. Accordingly, the SI-based inspection apparatus 100 of the present embodiment may be easily utilized in a bright field (BF) method of a split optical system structure in which the illumination optical system Ill-Optics and an imaging optical system Ima-Optics are separate from each other. Here, the illumination optical system Ill-Optics may indicate an optical system on a path from the light source 110 to the object lens 150, and the imaging optical system Ima-Optics may indicate an optical system on a path from the object lens 150 to the TDI camera 180. A BF method may indicate a method of observing an inspection object 200 using direct illumination on the inspection object 200, and may be contrasted with a dark field (DF) method of observing the inspection object 200 using a scattered beam.

Some inspection systems may utilize multiple photographing for the same field of view (FOV) while rotating a grating, as well as a process of integrating images in a frequency domain by performing a fast Fourier transform (FFT) to combine images of different phases, and then restoring the images by performing an inverse FFT into a time domain. In other words, such systems may require extensive post image processing. This post image processing may prevent the inspection of the inspection object 200 from happening in real time.

To avoid the post image processing, an inspection apparatus may utilize a structure (not shown) in which a light beam passes through a grating twice by rotating the grating, where the grating is arranged between a beam splitter and an object lens. However, the inspection apparatus having such a structure may have a large amount of light loss and may not be utilized in a split optical system in which the illumination optical system Ill-Optics and the imaging optical system Ima-Optics are separate from each other. Furthermore, the inspection apparatus of such a structure may not use a TDI camera because an area camera may be required to capture area images. Thus, the speed of the inspection apparatus may be very slow.

On the other hand, the SI-based inspection apparatus 100 of the present embodiment may solve such problems by including the PSG 130 and the TDI camera 180. For example, the SI-based inspection apparatus 100 of the present embodiment may be easily used in a general split optical system, may use a light source of relatively low illuminance, and may inspect the inspection object 200 at a high speed and in real time with high resolution.

Thus, the SI-based inspection apparatus 100 may inspect the inspection object 200 by forming a light beam into a structured illumination (SI) pattern in the illumination optical system Ill-Optics, reflecting the light beam onto the inspection object 200 using an imaging optical system Ima-Optics distinct from the illumination optical system Ill-Optics, capturing a first image of the inspection object 200 by detecting the reflected beam using a first sensor region of a line scan camera (i.e., TDI camera 180) while the inspection object 200 is located at a first position, capturing a second image of the inspection object 200 by detecting the reflected beam using a second sensor region of the line scan camera while the inspection object 200 is located at a second position different from the first position, integrating the first image and the second image by averaging a phase of the first image and a phase of the second image to produce an integrated image, and determining whether the inspection object includes a defect in real time based on the integrated image.

FIGS. 2A through 2E are conceptual diagrams illustrating various types of PSGs 130 used in the SI-based inspection apparatus 100 of FIG. 1. FIGS. 2A through 2E are described together with FIG. 1, and the description of elements already given with reference to FIG. 1 is briefly provided or omitted.

Figure 2A:
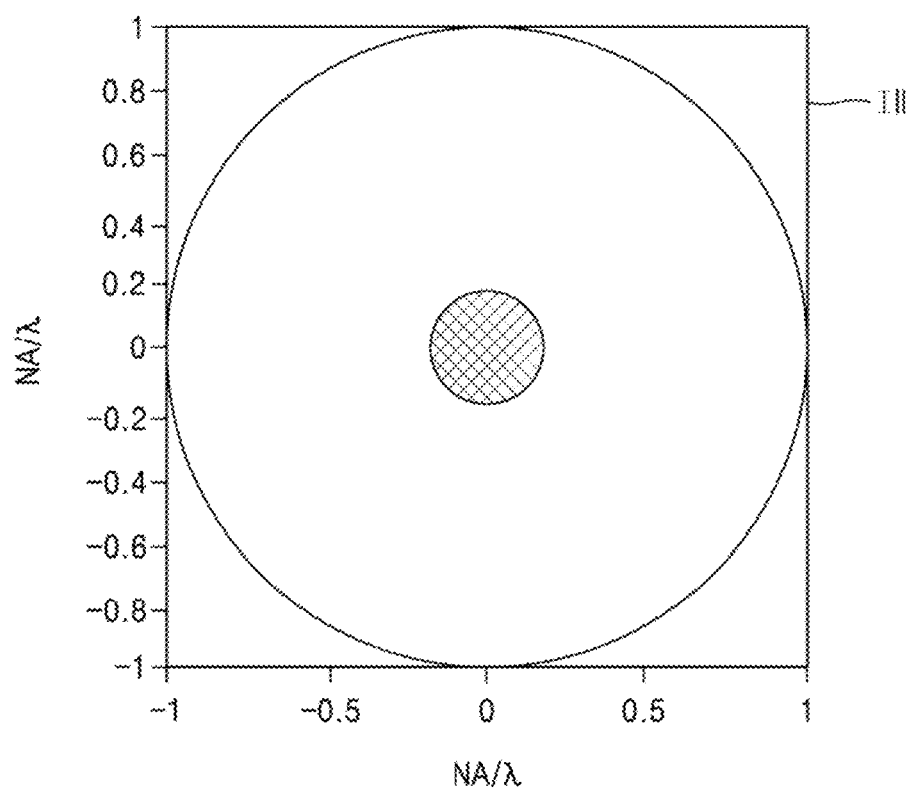

FIG. 2A illustrates a shape of illumination Ill before the light beam passes through the PSG 130 according to an embodiment of the present disclosure. The illumination Ill may be formed by the light source 110 itself or as the light beam of the light source 110 passes through an aperture stop having a shape of the corresponding illumination Ill. For reference, the shape of the illumination Ill may be referred to as a small sigma (σ) illumination, and the sigma σ may correspond to a diameter or a value of the diameter multiplied by a numerical aperture (NA). A large circle on the outer side may correspond to a pupil plane.

Figure 2B:
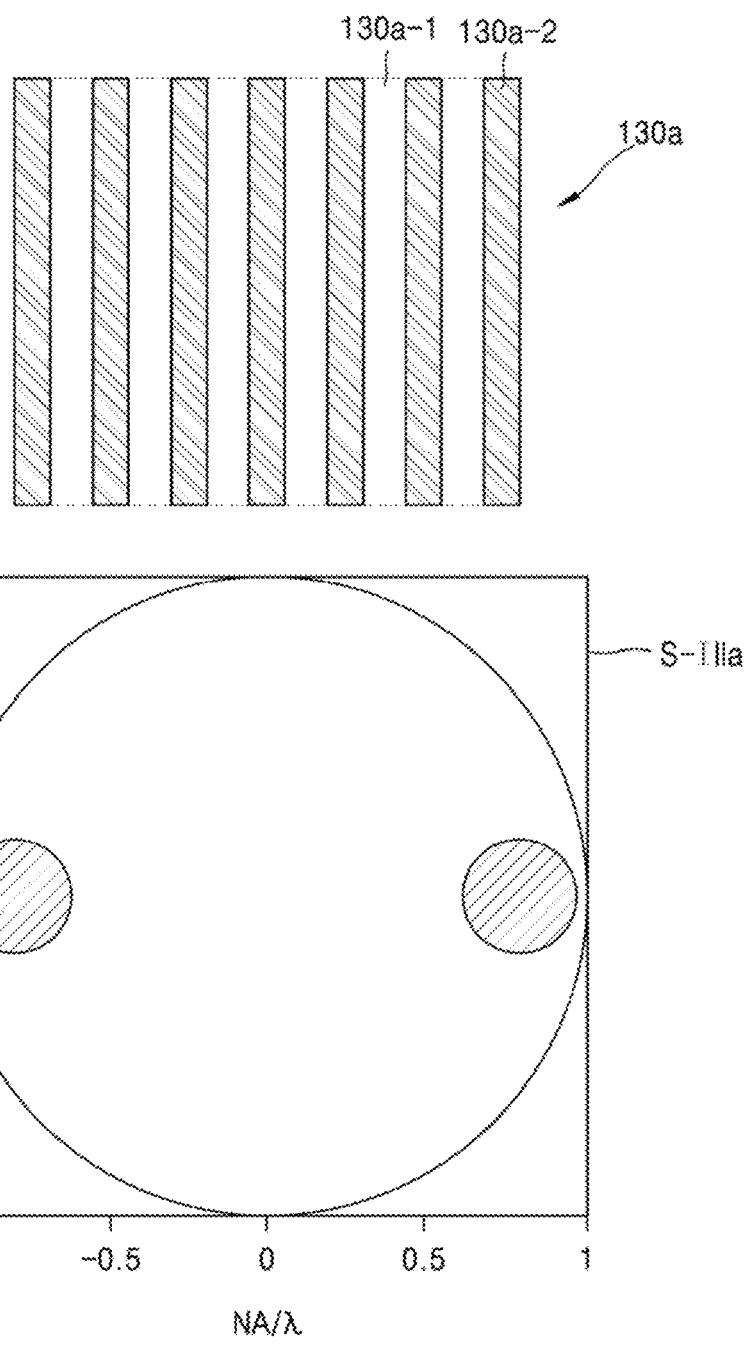

Referring to FIG. 2B, in the SI-based inspection apparatus 100, according to an embodiment of the present disclosure, a PSG 130a may have a line-and-space shape. Here, in the line-and-space shape of the PSG 130a, the space may not be an empty space but may be a portion thinner than the line (i.e., in a direction perpendicular to the surface of the PSG 130a). For example, a first portion 130a-1 corresponding to the space may be thinner than a second portion 130a-2 corresponding to the line. With respect to a cross-sectional structure of the PSG 130a, more detailed descriptions are given with reference to FIGS. 3A and 3B.

The PSG 130a may produce dipole illumination S-Illa as illustrated on the bottom of FIG. 2B. The dipole illumination S-Illa may be formed by diffraction and phase shift that occurs as the small sigma σ illumination Ill in FIG. 2A passes through the PSG 130a. Diffraction may occur as the light beam passes through the first portion 130a-1 of the PSG 130a. For example, assuming that the second portion 130a-2 of the PSG 130a is opaque and the light beam does not pass through, and that the first portion 130a-1 and the second portion 130a-2 are equally spaced, a path of a diffracted beam may be calculated by the following Formula 1.

$$\mathrm{Sin}(\theta)-\mathrm{Sin}(\theta i)=m\lambda/2d \qquad \text{[Formula 1]}$$

Here, θ and θi may indicate a diffraction angle of the diffracted beam and an angle of incidence of an incident beam, respectively, 2d may indicate a period of a pattern formed by the first part 130a-1 and the second part 130a-2, and m may be a diffraction order having 0, ±1, ±2, . . . , etc. It may be understood from Formula 1 that for the incident beam of the same wavelength λ and the same angle of incidence θi, the diffraction angle of the diffracted beam increases as the period, 2d, of the pattern decreases. Thus, by adjusting the period of the pattern, positions of the dipole illumination S-Illa illustrated at the bottom of FIG. 2B may be adjusted.

In the case of a binary grating, a metal layer such as chromium may be formed in the second portion 130a-2 and the light beam may not pass through the second portion 130a-2. In this binary grating, an illumination pole may be further formed at the center portion by a $0^{th}$-order diffracted beam component (refer to FIG. 4A). However, in some embodiments of the SI-based inspection apparatus 100 and PSG 130a, at least a portion of the light beam may pass through the second portion 130a-2. Since the light beam having passed through the second portion 130a-2 may have a phase difference from the light beam having passed through the first portion 130a-1, the illumination pole may not be formed at the center portion.

A method of removing the center illumination pole may be implemented not only by modifying PSG 130a, but also by an off-axis binary grating. For example, by tilting the angle of incidence of the incident beam, only the $0^{th}$-order diffracted beam component and a+$1^{st}$-order or −$1^{st}$-order diffracted beam component may appear on the pupil plane.

Referring to FIG. 2C, in the SL-based inspection apparatus 100, according to an embodiment of the present disclosure, a PSG 130b may have a checkered shape. In particular, a first portion 130b-1 and the second portion 130b-2 may be alternately arranged in a first direction (x direction) and a second direction (y direction). The PSG 130b may generate quadrupole illumination S-Illb as illustrated at the bottom of FIG. 2C. The quadrupole illumination S-Illb may be formed by diffraction and phase shift, both of which occur as the small sigma σ illumination Ill in FIG. 2A passes through the PSG 130b.

Figure 2D:
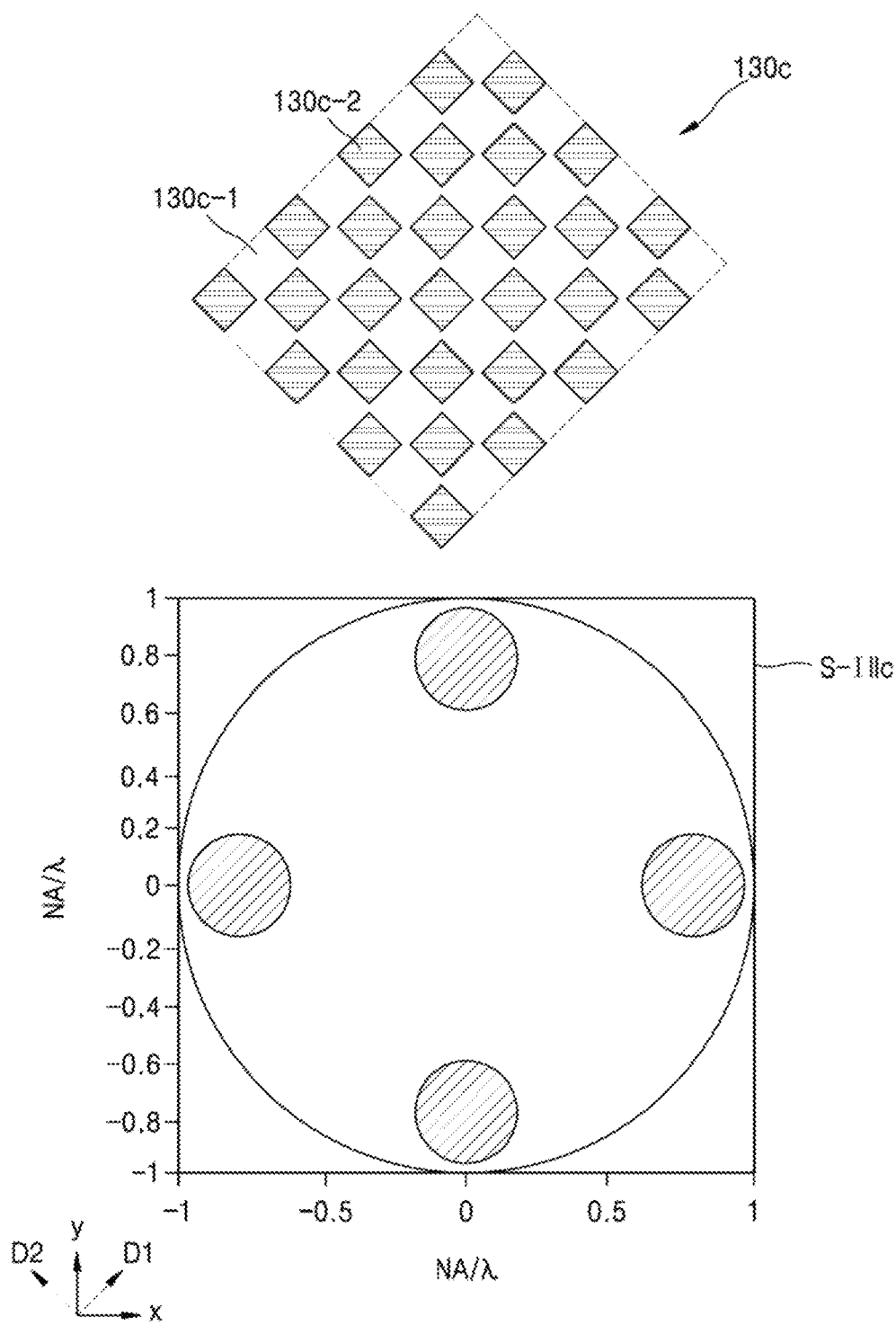

Referring to FIG. 2D, in the SI-based inspection apparatus 100, according to an embodiment of the present disclosure, a PSG 130c may have a checkered shape similar to the PSG 130b of FIG. 2C but may be rotated relative to PSG 130b of FIG. 2C.

For example, a first portion 130c-1 and a second portion 130c-2 may be alternately arranged in two diagonal directions (D1 and D2) between the first direction (x direction) and the second direction (y direction). The PSG 130c may generate quadrupole illumination S-Illc as illustrated at the bottom of FIG. 2D. The quadrupole illumination S-Illc may be formed by diffraction and phase shift, both of which occur as the small sigma σ illumination Ill in FIG. 2A passes through the PSG 130c.

Comparing the PSG 130b of FIG. 2C with the PSG 130c of FIG. 2D, a rotation of about 45° of the PSG 130b of FIG. 2C clockwise or counterclockwise may result in the PSG 130c of FIG. 2D. In addition, it may also be understood that the quadrupole illumination S-Illc of the PSG 130c of FIG. 2D corresponds to a result of rotation of about 45° of the quadrupole illumination S-Illb of the PSG 130b of FIG. 2C. Thus, the PSG 130b of FIG. 2C and the PSG 130c of FIG. 2D may not need to be manufactured separately to in order for both of them to be utilized. Instead, one of PSG 130b of FIG. 2C and the PSG 130c of FIG. 2D may be manufactured and arranged at the front end of the light source 110, and the other of PSG 130b of FIG. 2C and the PSG 130c of FIG. 2D may be obtained through rotation.

Referring to FIG. 2E, in the SI-based inspection apparatus 100, according to an embodiment of the present disclosure, the PSG 130d may have a mesh shape. In particular, a first portion 130d-1 may continuously extend in the first direction (x direction) and the second direction (y direction) like netting threads of the mesh. In addition, the second portion 130d-2 may be arranged at a knot position of the mesh and alternately arranged with the first portion 130d-1 in the first direction (x direction) and the second direction (y direction).

The PSG 130d may generate quadrupole illumination S-Illd as illustrated at the bottom of FIG. 2E. The quadrupole illumination S-Illd may be formed by diffraction and phase shift, both of which occur as the small sigma σ illumination Ill in FIG. 2A passes through the PSG 130d.

It may be understood that the quadrupole illumination S-Illd of the PSG 130d of FIG. 2E and the quadrupole illumination S-Illc of the PSG 130c of FIG. 2D may have a similar structure. In both the quadrupole illumination S-Illc of the PSG 130c of FIG. 2D and the quadrupole illumination S-Illd of the PSG 130d of FIG. 2E, four illumination poles may be arranged adjacent to respective sides of a square. However, the quadrupole illumination S-Illb of the PSG 130b of FIG. 2C may be arranged such that four illumination poles are adjacent to respective corner portions of the square. For reference, a structure in which the first portions (130b-1, 130c-1, and 130d-1) and the second portions (130b-2, 130c-2 and 130d-2) are alternately arranged in the first direction (x direction) and the second direction (y direction), like the PSGs (130b, 130c, and 130d) in FIGS. 2C, 2D, and 2E, respectively, may be referred to as an orthogonal structure.

FIG. 3A illustrates a cross-sectional view of the PSG 130b in FIG. 2C taken along line I-I' and an intensity graph of illumination corresponding thereto, and FIG. 3B illustrates a cross-sectional view of a general binary grating and an intensity graph of illumination corresponding thereto according to embodiments of the present disclosure.

Referring to FIG. 3A, in the SI-based inspection apparatus 100, according to embodiments of the present disclosure, the PSG 130b may include a first transparent layer 132 and a second transparent layer 134. The first transparent layer 132 and the second transparent layer 134 may include an identical transparent material or different transparent materials. In one example, both the first transparent layer 132 and the second transparent layer 134 may include quartz. According to another example, only the first transparent layer 132 may include quartz and the second transparent layer 134 may include another transparent material, such as glass and silicon oxide, instead of quartz. However, materials of the first transparent layer 132 and the second transparent layer 134 are not limited to the materials above.

The PSG 130b may include a first region A1 only including the first transparent layer 132 and a second region A2 including both the first transparent layer 132 and the second transparent layer 134. The first region A1 may correspond to the first portion of the PSG 130b (refer to 130b-1 in FIG. 2C) and the second region A2 may correspond to the second portion of the PSG 130b (refer to 130b-2 in FIG. 2C). In addition, structurally, the first region A1 and the second region A2 may correspond to the first portions (130a-1, 130c-1, and 130d-1) and the second portions (130a-2, 130c-2, and 130d-2) of the PSGs (130a, 130c, and 130d) in FIGS. 2B, 2D, and 2E, respectively.

A first incident light beam L1in incident on the first region A1 and a second incident light beam L2in incident on the second region A2 may have identical phase at an interface surface between the second transparent layer 134 and the air. However, a first outgoing light beam L1out emitted through the first region A1 of the PSG 130b may be out of phase with a second outgoing light beam L2out emitted through the second region A2. In some cases, the first incident light beam L1in and the first outgoing beam L1out may correspond to a first portion of a beam output by a light source 110. Similarly, the second incident light beam L2in and the second outgoing light beam L2out may correspond to a second portion of the beam output by light source 110.

The first incident light beam L1 in may pass through the air up to the interface surface between the first transparent layer 132 and the air, and the second incident light beam L2in may pass through the second transparent layer 134 up to an interface surface between the first transparent layer 132 and the second transparent layer 134. Since refractive indices of the air and the second transparent layer 134 are different from each other, phases of the first incident light beam L1in and the second incident light beam L2in at the interface surface between the first transparent layer 132 and the air or the first transparent layer 132 and the second transparent layer 134 may be changed, and a phase difference may occur. Since both the first incident light beam L1in and the second incident light beam L2in pass through the first transparent layer 132, which may have substantially the same thickness throughout, the phase difference at the interface surface between the first transparent layer 132 and the air on an outgoing surface may be maintained as is. As a result, the first outgoing light beam L1out and the second outgoing light beam L2out may maintain the phase difference that has been generated while they pass through the air and the second transparent layer 134.

FIG. 3B illustrates a general binary grating 30 that may include a quartz transparent layer 32 and an opaque chrome layer 34 on the quartz transparent layer 32 according to embodiments of the present disclosure. In other words, the binary grating 30 may include a first region B1 only including the quartz transparent layer 32 and a second region B2 including both the quartz transparent layer 32 and the opaque chrome layer 34. The general binary grating 30 may have a similar form to the PSGs (130b, 130c, and 130d) in FIGS. 2C through 2E. However, the opaque chromium layer 34 may be arranged, instead of the second transparent layer 134, in the second portions (130b-2, 130c-2, and 130d-2).

The first incident light beam L1in incident on the first region B1 of the binary grating 30 may pass through the quartz transparent layer 32 and travel as the first outgoing light beam L1out in the same direction as the first incident light beam L1in. By contrast, the second incident light beam L2in incident on the second region B2 of the binary grating 30 may be reflected by the opaque chrome layer 34 and travel as a second reflected light beam L2re in a direction opposite to the direction of the first incident light beam L1in. In other words, the second incident light beam L2in may not pass through the binary grating 30.

In some examples of the SI-based inspection apparatus 100, all or substantially all of incident light beams may substantially pass through the PSG 130 (e.g., through PSG 130b of FIG. 3A). In other words, the second region A2 of the PSG 130b may delay light beams, and cause the phase of the second region A2 to be different from the phase of the light beams passing through the first region A1, but may not actually block the light beams.

On the other hand, in the case of the binary grating 30, the light beams may not pass through the second region B2 at all. Accordingly, as illustrated in the graph below the PSG 130b and the binary grating 30, the intensity may be significantly different from each other. For example, in the case of the binary grating 30 of FIG. 3B, light loss (which may exceed 50%) may occur due to the second region B2. Accordingly, the light beam having passed through the PSG 130b and the light beam having passed through the binary grating 30 may show a difference in intensity difference of more than 2 times. However, the intensity difference of the light beam having passed through the binary grating 30 and the PSG 130b is not limited to the this value.

FIGS. 4A through 4E illustrate various types of PSGs and their corresponding SIs and amplitude graphs according to embodiments of the present disclosure. In the amplitude graphs, the x and y axes may indicate positions, a z axis may indicate amplitude of illumination, and the units may be relative. Descriptions already given with reference to FIGS. 1 through 3B are briefly provided or omitted.

Referring to FIG. 4A, a tripole illumination S-Ill may be formed by the binary grating 30. Here, the binary grating 30 may have the line-and-space structure similar to the PSG 130a in FIG. 2B. In other words, the binary grating 30 may include a transparent layer (refer to 32 in FIG. 3B) in a first portion (refer to 130a-1 in FIG. 2B) corresponding to the space, and the quartz transparent layer 32 and a chrome layer (refer to 34 in FIG. 3B) in a second portion (refer to 130a-2 in FIG. 2B). As described above, the tripole illumination S-Ill due to the binary grating 30 may include an illumination pole caused by the $0^{th}$-order diffracted beam component at the center portion.

In the amplitude graph, since about 50% or less of the light beam passes through the binary grating 30, the amplitude may be relatively small. However, when a pattern formed by the first portion and the second portion of the binary grating 30 has a first pitch P1, a waveform of the tripole illumination S-Ill may correspondingly have the first pitch P1.

Figure 4B:
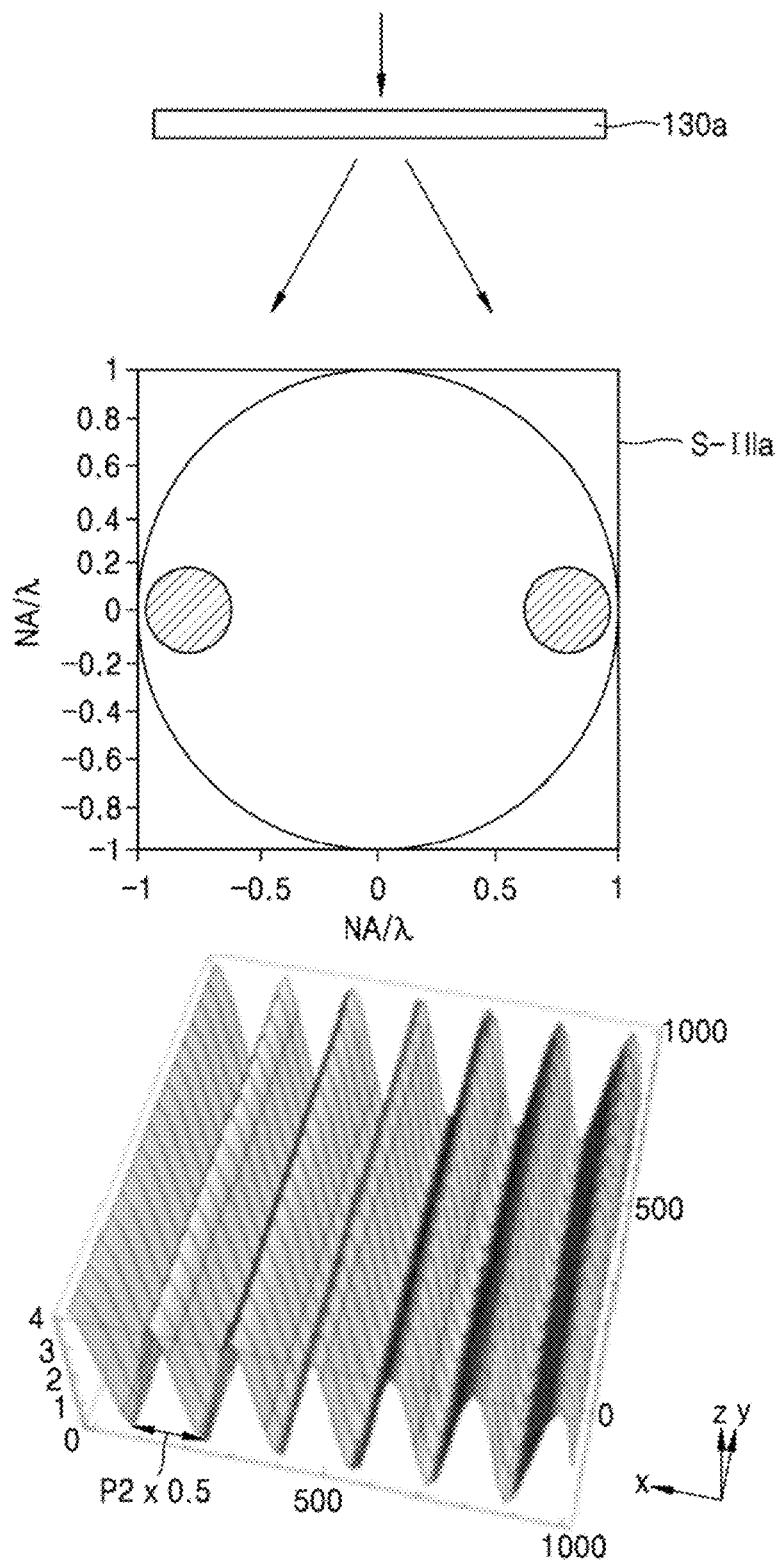

Referring to FIG. 4B, the dipole illumination S-IIIa may be formed by the PSG 130a in FIG. 2B according to embodiments of the present disclosure. As described above, the dipole illumination S-IIIa may not include the illumination pole at the center portion. In the amplitude graph, since the light beam passes through the PSG 130a at approximately 100% intensity the amplitude may be relatively large. When the pattern formed by the first portion (refer to 130a-1 in FIG. 2B) and the second portion (refer to 130a-2 in FIG. 2B) of the PSG 130a has a second pitch P2, a waveform of illumination may have a pitch of P2*0.5 that corresponds to half of the second pitch P2. A more detailed description of a calculation of the second pitch P2 of the waveform of the PSG 130a is given with reference to FIG. 5A.

Figure 4C:
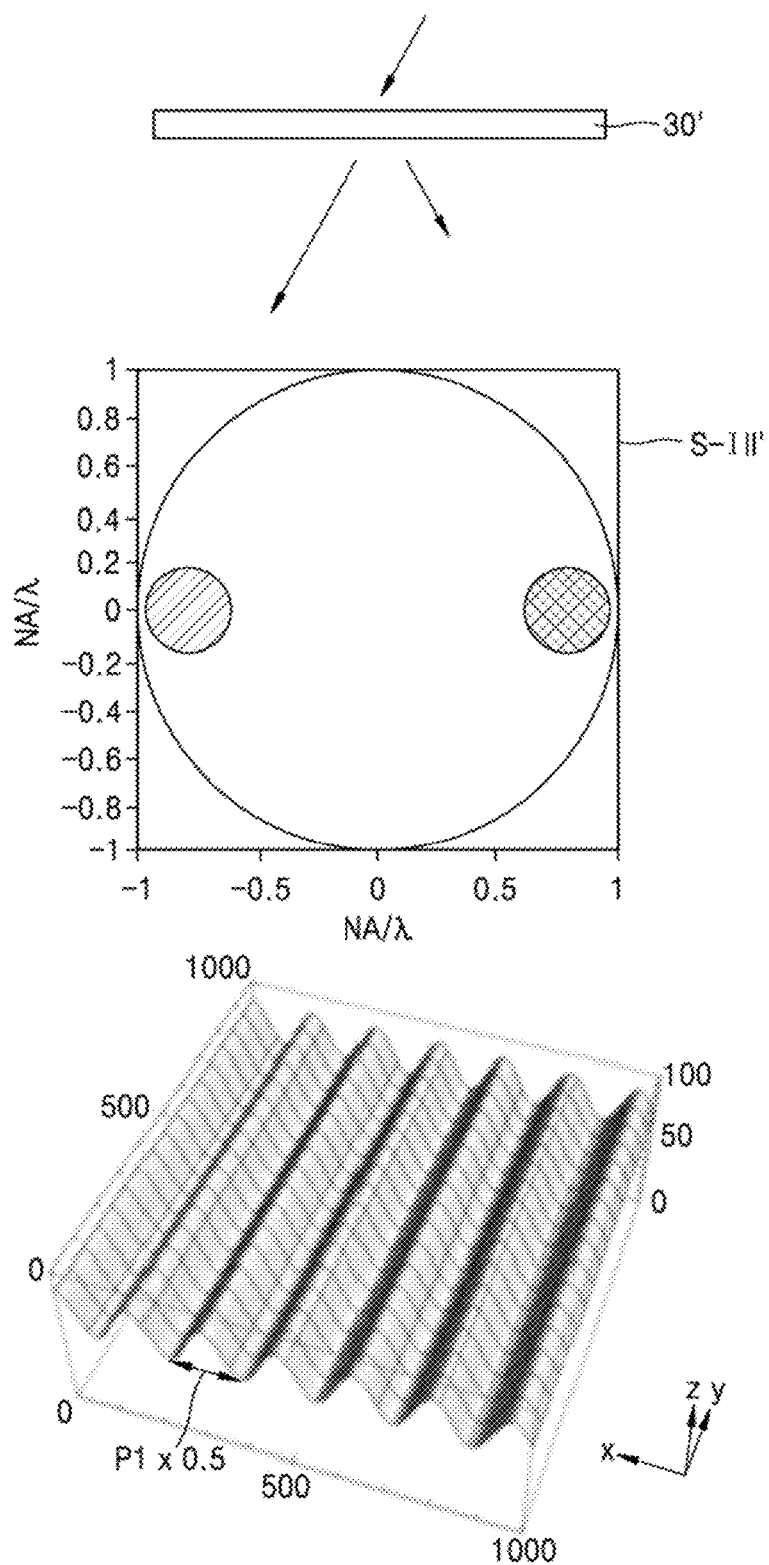

Referring to FIG. 4C, dipole illumination S-Ill' may be formed by an off-axis binary grating 30' according to embodiments of the present disclosure. Here, the off-axis binary grating 30' may have a structure substantially identical to the line-and-space structure like the binary grating 30 of FIG. 3B. The off-axis binary grating 30' may include a first portion of the quartz transparent layer 32, a second portion of the quartz transparent portion 32, and an opaque chrome layer 34. However, in the case of the off-axis binary grating 30', an angle of incidence at which the light beam is incident may be different from that in the case of the binary grating 30 in FIG. 4A. The dipole illumination S-Ill' due to the off-axis binary grating 30' may not include the illumination pole at the center portion. In the dipole illumination S-Ill', a left illumination pole may be due to the $0^{th}$-order diffracted light beam component and a right illumination pole may be due to the $+1^{st}$-order diffracted light beam component.

In the amplitude graph, since less than about 50% of the light beam passes through the off-axis binary grating 30', an amplitude of the light beam may also be relatively small. When a pattern formed by the first portion and the second portion of the off-axis binary grating 30' has the first pitch P1, the waveform of illumination may have a pitch of about 0.5*P1 that corresponds to a half of the first pitch P1.

Figure 4D:
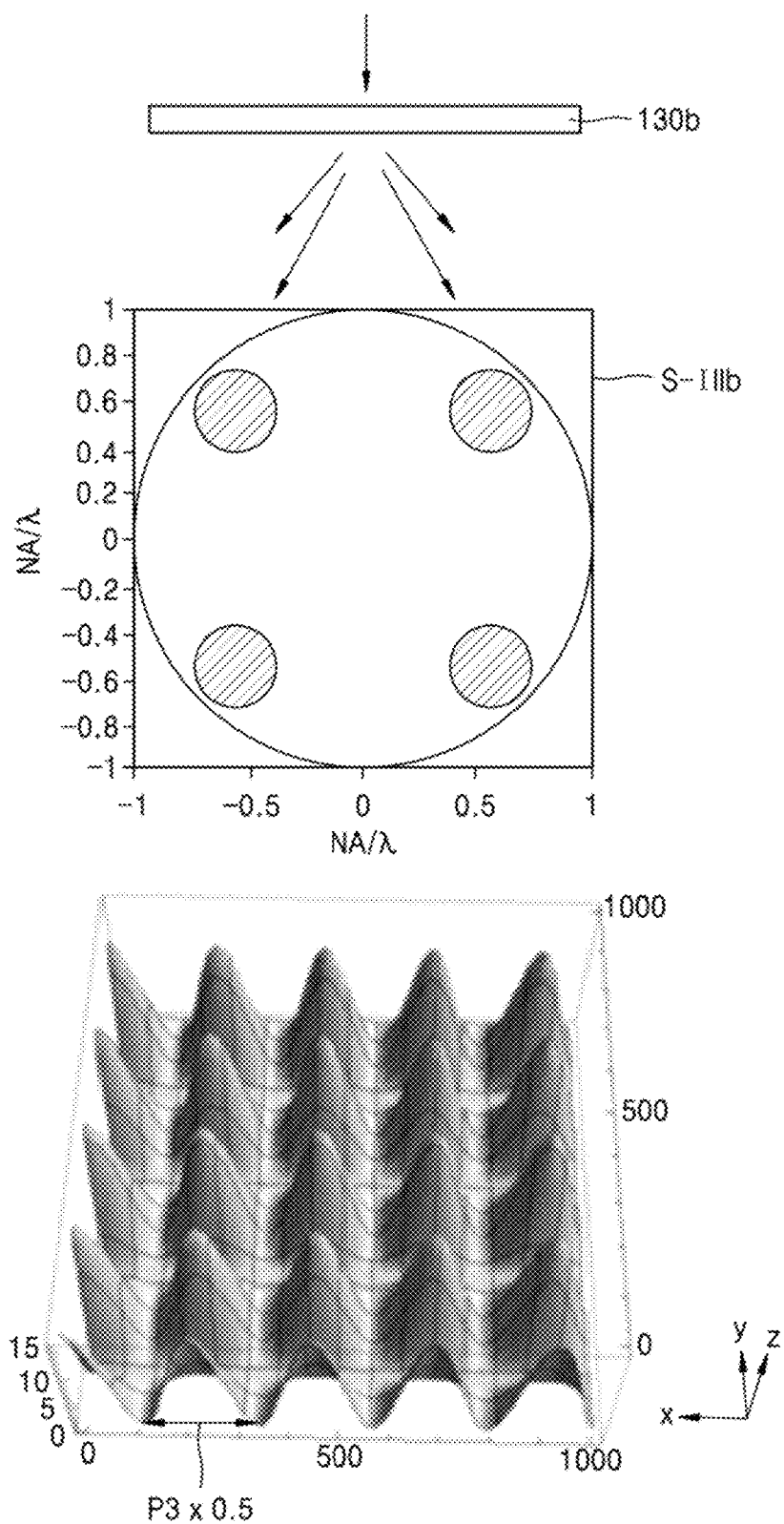

Referring to FIG. 4D, the quadrupole illumination S-IIIb may be formed by the PSG 130b in FIG. 2C according to embodiments of the present disclosure. In the amplitude graph, since the light beam passes through the PSG 130b (i.e., corresponding to PSG 130b of FIG. 3A) at about 100% intensity, the amplitude of the light beam may be relatively large. However, when the pattern formed by the first portion (refer to 130b-1 in FIG. 2C) of the PSG 130b and the second portion (refer to 130b-2 of FIG. 2C) has a third pitch P3 of about P3 in both the first direction (x direction) and the second direction (y direction), a waveform of illumination may have a pitch of about 0.5*P3 that corresponds to a half of the third pitch P3 in both the first direction (x direction) and the second direction (y direction). A more detailed description of a calculation of the third pitch P3 of the waveform of the PSG 130b is given with reference to FIG. 5B.

Figure 4E:
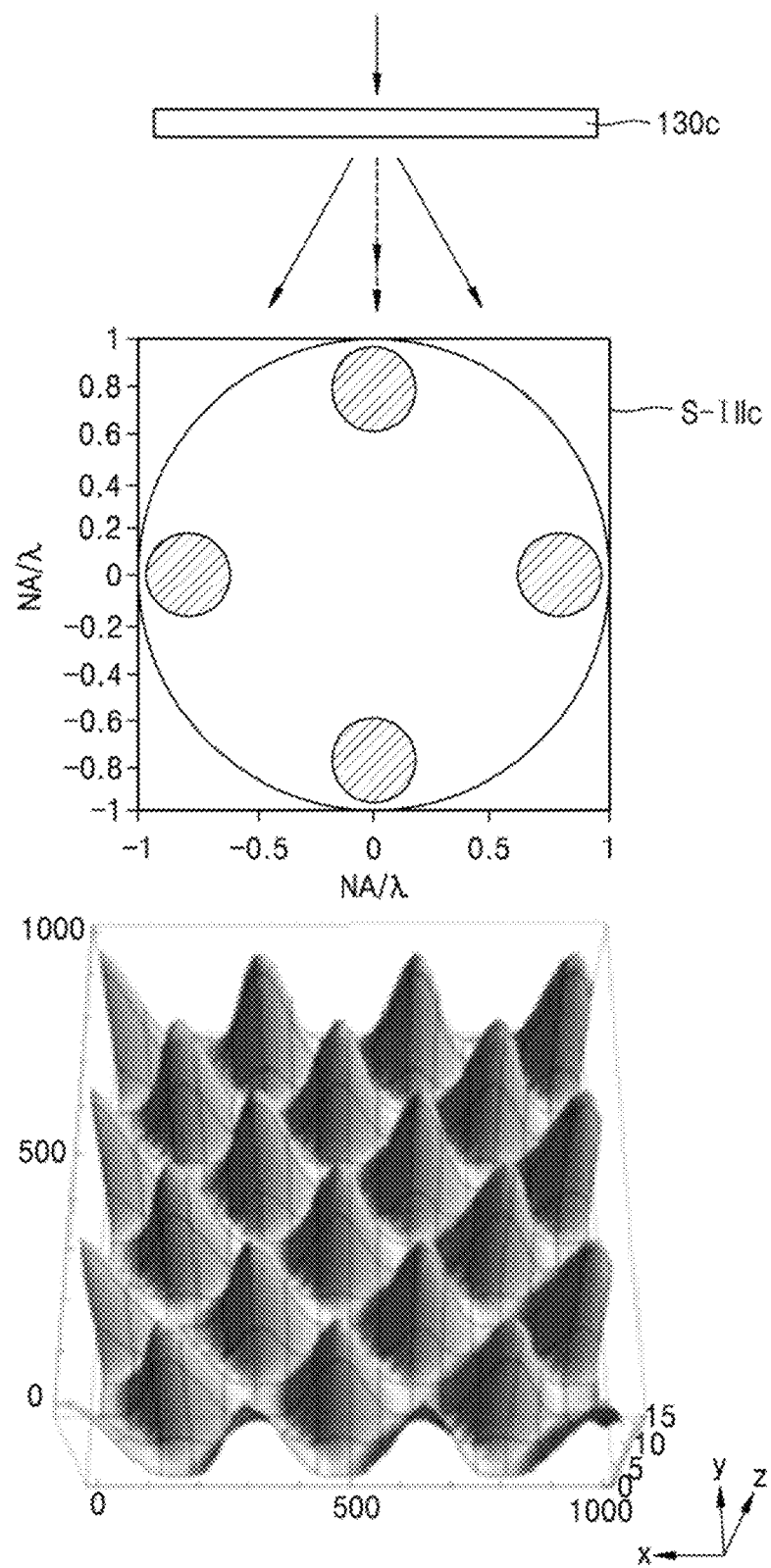

Referring to FIG. 4E, quadrupole illumination S-IIIc may be formed by the PSG 130c in FIG. 2D according to embodiments of the present disclosure. In the amplitude graph, since the light beam passes through the PSG 130c at substantially about 100% intensity, the amplitude of the light beam may be relatively large. A waveform of illumination of the PSG 130c in FIG. 4E may correspond to the case in which the waveform of illumination of the PSG 130b in FIG. 4D is rotated clockwise or counterclockwise by about 45°. Thus, a relationship between the pitch of the PSG 130c and the pitch of the waveform of illumination in FIG. 4E may be substantially the same as the pitch of the PSG 130b and the pitch of the waveform of illumination in FIG. 4D.

As described above, it may be readily understood that the quadrupole illumination (refer to the quadrupole S-IIId in FIG. 2E) that is substantially the same form as the quadrupole illumination S-IIIc is implemented by the PSG 130d in FIG. 2E.

For reference, by comparing FIGS. 4A through 4E with each other, when the contrasts of the dipole, quadrupole, and quadrupole illuminations S-IIIa, S-IIIb, and S-IIIc in FIGS. 4B, 4D, and 4E are defined to be about 1, the contrasts of the quadrupole illuminations S-Ill and S-Ill' in FIGS. 4A and 4C may be significantly lower (e.g., at about 0.38 and about 0.20, respectively). This may be because, as described above, more than about 50% of the incident light beam does not pass and is blocked by the binary grating 30 or the off-axis binary grating 30'.

FIGS. 5A and 5B are conceptual diagrams for designing of the dipole PSG S-IIIa and the quadrupole PSG S-IIIb, respectively, according to embodiments of the present disclosure. FIGS. 5A and 5B incorporate aspects described with reference to FIG. 1, and description already given with reference to FIGS. 1 through 4E are briefly provided or omitted.

Referring to FIG. 5A, when the SI-based inspection apparatus 100 of the present embodiment inspects the inspection object 200 using the line-and-space pattern, the resulting dipole illumination may improve the resolution of the inspection image. For example, when the lines and the spaces are alternately arranged in the first direction (x direction) and the line-and-space pattern is formed in a shape extending in the second direction (y direction) in the inspection object 200, as illustrated in FIG. 5A, the dipole illumination S-IIIa in which two illumination poles are apart from each other in the first direction (x direction) may improve resolution. In addition, when the lines and the spaces of the line-and-space pattern are alternately arranged in the second direction (y direction) and have shapes extending in the first direction (x direction) in the inspection object 200, the dipole illumination in which two illumination poles are apart from each other in the second direction (y direction) may improve resolution.

The dipole illumination S-IIIa in FIG. 5A may be implemented by using the PSG 130a of the line-and-space type in FIG. 2A. When the first portion 130a-1 and the second portion 130a-2 of the PSG 130a are arranged alternately with substantially the same width in the first direction (x direction), a pattern period Px in the first direction (x direction) of the pattern including the first portion 130a-1 and the second portion 130a-2 may have a relationship with the dipole illumination S-IIIa as the following Formula 2.

$$Px=\lambda/(NA-\sigma) \qquad \text{[Formula 2]}$$

Here, the wavelength λ may be the wavelength of illumination, the NA may be the numerical aperture of the object lens, and the sigma σ may indicate a value obtained by multiplying a diameter of the illumination pole by the NA. According to a measurement structure on the inspection object 200, an optimum angle of incidence for improving resolution may be varied. Here, the angle of incidence may increase as a distance of the illumination pole from the center increases. In addition, as a pitch of a grating decreases, a distance between two illumination poles may increase. Thus, to improve resolution, the two illumination poles may be adjusted at proper positions in a circle as long as the two illumination poles do not deviate from the circle corresponding to the NA by adjusting the pattern period Px of the PSG 130a.

Therefore, after the NA, the sigma σ, and the wavelength λ are determined, the pattern period Px of the PSG 130a may be determined by Formula 2. Thus, when conditions of an optical system optimized for pattern inspection of the line-and-space type on the inspection object 200 (i.e., the NA, the sigma σ, and the wavelength λ) are determined, the PSG 130a may be designed accordingly based on Formula 2.

Referring to FIG. 5B, when the SI-based inspection apparatus 100 of the present embodiment inspects the inspection object 200 using a pattern corresponding to a checkered shape or a mesh shape, the resulting quadrupole illumination may improve the resolution of the resulting image. For example, when a pattern arranged in the checkered shape or the mesh shape in the first direction (x direction) and the second direction (y direction) is formed on the inspection object 200, as illustrated in FIG. 5B, the quadrupole illumination S-IIIb, in which four illumination poles are apart from each other in both the first direction (x direction) and the second direction (y direction), may improve the resolution.

In addition, in the case where the pattern of the checkered shape is arranged in two diagonal directions (refer to D1 and D2 coordinates in FIG. 2D) on the inspection object 200, the quadrupole illumination (refer to S-IIIc in FIG. 2D), in which four illumination poles are apart from each other in the two diagonal directions (D1 and D2), may improve the resolution. Similarly, even when a pattern of the mesh shape is formed on the inspection object 200, the quadrupole illumination (refer to S-IIId in FIG. 2E), in which four illumination poles are apart from each other in the diagonal directions (D1 and D2), may improve the resolution.

The quadrupole illumination S-IIIb in FIG. 5B may be implemented by using the PSG 130b of the checkered shape in FIG. 2C. When the first portion 130b-1 and the second portion 130b-2 of the PSG 130b are arranged alternately with substantially the same width in the first direction (x direction) and the second direction (y direction), the pattern period Px in the first direction (x direction) and a pattern period Py in the second direction (y direction) of the pattern formed by the first portion 130b-1 and the second portion 130b-2 of the PSG 130b may have relationships defined by the following Formula 3 and Formula 4, respectively.

$$Px=(2)^{1/2}\lambda/(NA-\sigma) \quad \text{[Formula 3]}$$

$$Py=(2)^{1/2}\lambda/(NA-\sigma) \quad \text{[Formula 4]}$$

Here also, the wavelength λ may be the wavelength of illumination, the NA may be the NA of the object lens, and the sigma σ may indicate a value obtained by multiplying the diameter of the illumination pole by the NA. As described with reference to FIG. 5A, the four illumination poles may be positioned at appropriate locations in the circle while not deviating from the circle corresponding to the NA, by adjusting the pattern periods (Px and Py) of the PSG 130a for improving resolution. After the NA, the sigma σ, and the wavelength λ are determined, the pattern period Px in the first direction (x direction) and the pattern period Py in the second direction (y direction) of the PSG 130b may be determined by Formulas 2 and 3, respectively. Thus, when conditions of an optical system optimized for pattern inspection of the checkered shape on the inspection object 200 (e.g., the NA, the sigma σ, and the wavelength λ) are determined, the PSG 130b may be designed accordingly based on Formulas 3 and 4.

Figure 6A:
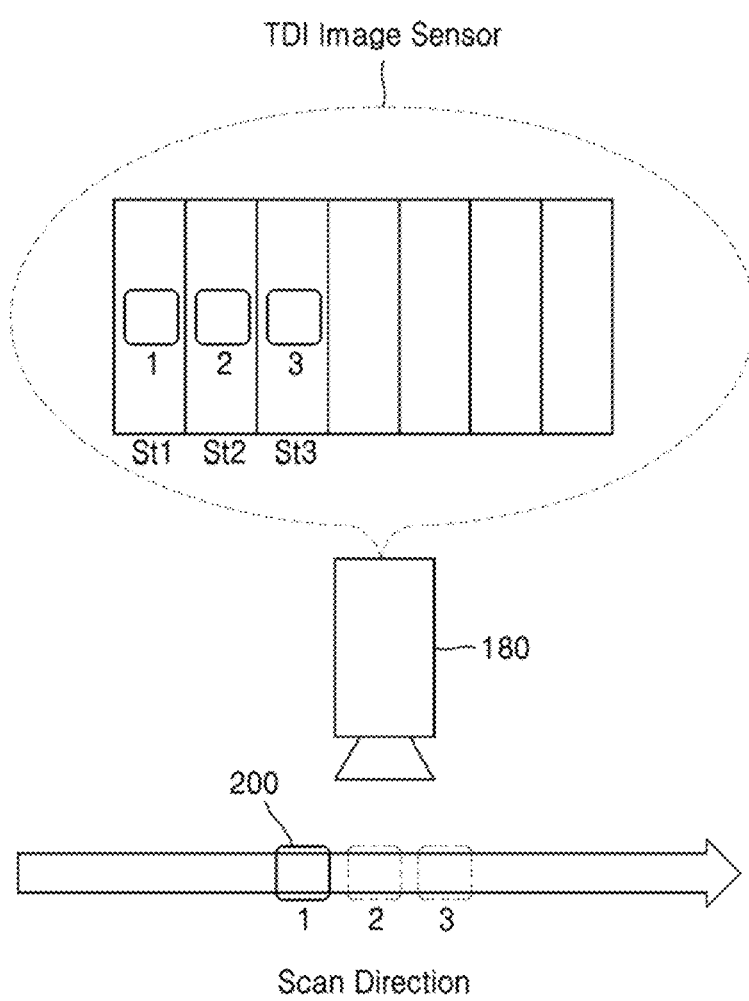
FIGS. 6A through 6C are conceptual diagrams illustrating an operation principle of a time-delayed integration (TDI) camera included in the SI-based inspection apparatus of FIG. 1 and illustrating an image capturing process by the TDI camera while an inspection object is moved according to embodiments of the present disclosure.
Figure 6B:
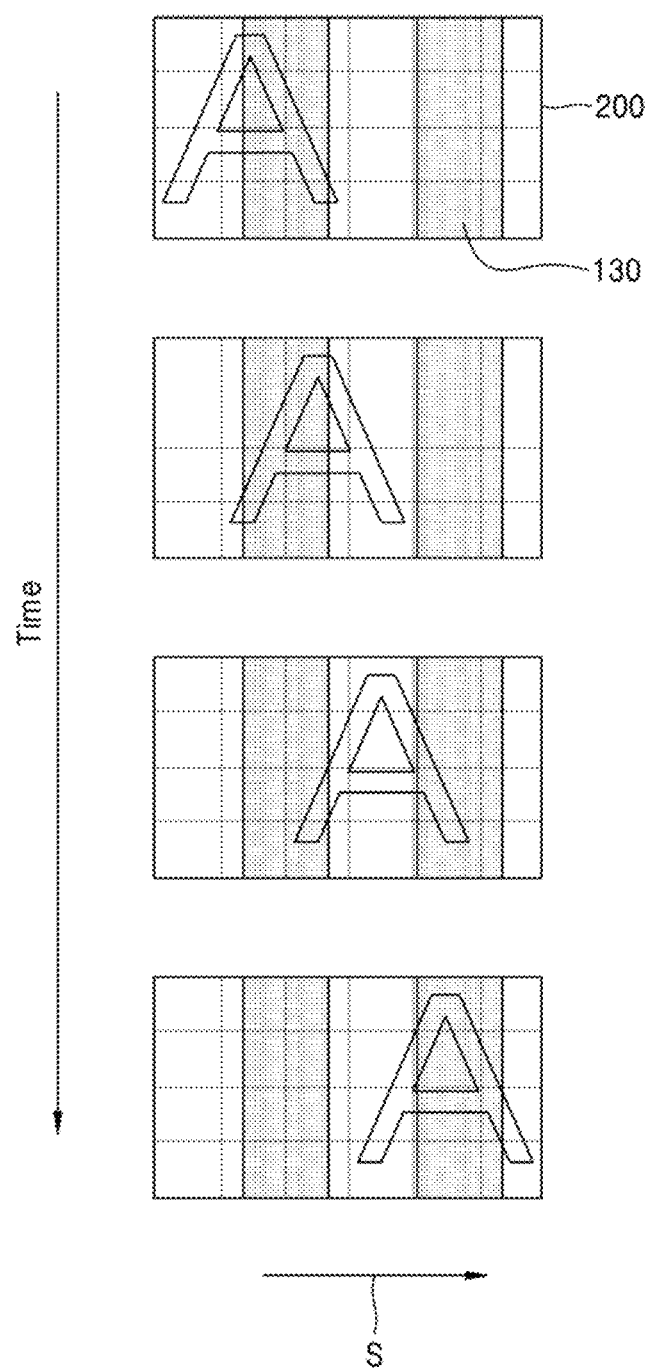
Figure 6C:
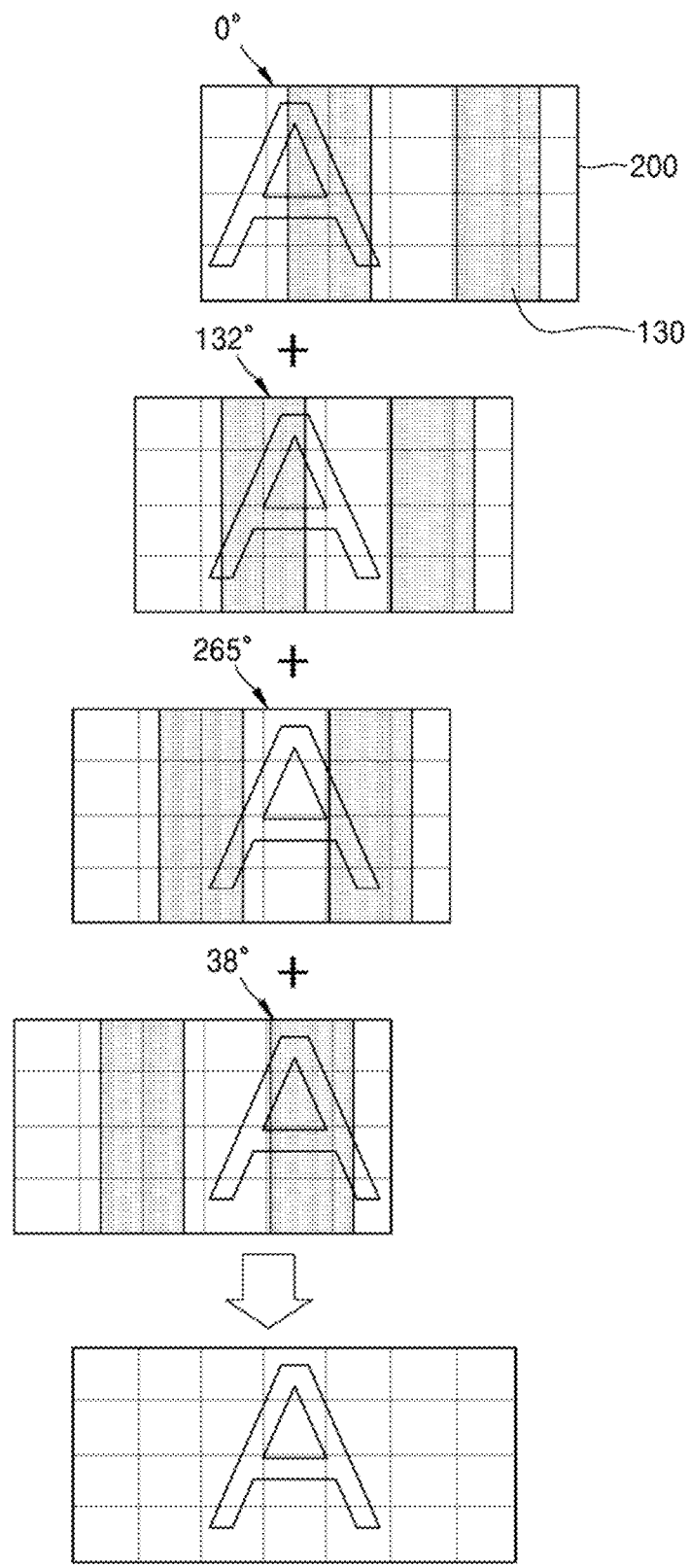

FIGS. 6A through 6C are conceptual diagrams illustrating an operation principle of a time-delayed integration (TDI) camera 180 included in the SI-based inspection apparatus 100 of FIG. 1, and also illustrating processes of capturing images by the TDI camera 180 while the inspection object 200 is moved according to embodiments of the present disclosure. FIGS. 6A and 6C are described together with FIG. 1, and description already given with reference to FIGS. 1 through 5B are briefly provided or omitted.

Referring to FIG. 6A, in the SI-based inspection apparatus 100 of the present embodiment, the TDI camera 180 may be a kind of line scan camera. Differences between a line scan camera and a general area scan camera are briefly described as follows. The area scan camera, in which pixels are arranged in a two-dimensional matrix type, may scan and transmit only one frame at a time and may capture images only in a state in which the area scan camera are stationary. On the other hand, the line scan camera, in which pixels are arranged in a line shape, may capture images while the inspection object and the line scan camera are moved.

In general, a line scan camera may be less expensive than an area scan camera because a line scan camera may have fewer pixels. Furthermore, a line scan camera may not be limited with respect to the length of the inspection object. However, the sensitivity of a line scan camera may be relatively low due to having a short exposure time. The TDI camera 180 may be configured to overcome drawbacks of a line scan camera, so that it may obtain clear images of the inspection object 200 by photographing the same portion of the inspection object 200 multiple times using a plurality of pixels of the line shape.

Detailed descriptions of an operation principle of the TDI camera 180 are given below.

Assuming that an object corresponding to the inspection object 200 moves in a scan direction of (1→2→3) as illustrated in FIG. 6A, images of the object may be captured at each of stages (St1, St2, and St3) of a TDI image sensor included in the TDI camera 180. Since the same object needs to be photographed at each of the stages (St1, St2, and St3), the object may be photographed at a subsequent stage a little later than a previous stage, according to a moving speed of the object. In other words, a moving speed of the FOV of the TDI camera 180 corresponding to each stage may be synchronized with the moving speed of the object. The reference to "time delayed" in the name of the TDI camera 180 may refer to this characteristic of its operation.

In some line scan cameras, a metal halide light source having a high illumination may be used to improve sensitivity. However, the TDI camera 180 may obtain high sharpness while using illumination of, for example, an LED having a lower intensity of illuminance. Thus, the TDI camera 180 may reduce installation cost and maintenance cost of the illumination and may be installed for a high-speed application in which it is not possible to install an alternative line scan camera. In addition, the TDI camera 180 may improve the inspection speed through effective and fast integration of images. Furthermore, in the TDI camera 180, since the images are integrated in a manner that phases of respective images are accumulated and averaged, it may not be required to integrate the images based on Fourier transformation of the phases. While operation of the TDI camera 180 may be based on synchronization and alignment with the inspection object 200, the level of synchronization and alignment may not be high, and a small amount of misalignment defect may not significantly affect quality of the image.

Referring to FIG. 6B, the inspection object 200 may be moved in the scanning direction S by the movement of the stage 170 in the scanning direction S. The gratings of the PSG 130 implementing the SI may be fixed. Accordingly, a pattern "A" formed on the inspection object 200 may move in the scanning direction S in which the inspection object 200 is moved, and the relative position of the pattern "A" with respect to the gratings may be changed. For reference, FIG. 6B illustrates the relative positions of the pattern "A" on the inspection object 200 according to time, and as indicated by a time arrow Time, the time may advance in a direction from the top to the bottom.

Referring to FIG. 6C, as the inspection object 200 is moved in the scanning direction S as illustrated in FIG. 6B, the TDI camera 180 may photograph the inspection object 200 in synchronization with the movement of the inspection object 200. As the inspection object 200 is moved, the phase of the captured image may be correspondingly changed. For example, as illustrated in FIG. 6C, the image at a first position from the top may correspond to the phase of about 0°, the image at a second position from the top may correspond to the phase of about 132°, the image at a third position from the top may correspond to the phase of about 265°, and the last fourth image from the top may correspond to the phase of about 38°. The TDI camera 180 may integrate the images together by accumulating and averaging the phases of images. Accordingly, in the SI-based inspection apparatus 100, the image post image processing for integrating images through a Fourier transform and/or a Fourier inverse transform considering the phase of each of the images may be unnecessary.

Figure 7:
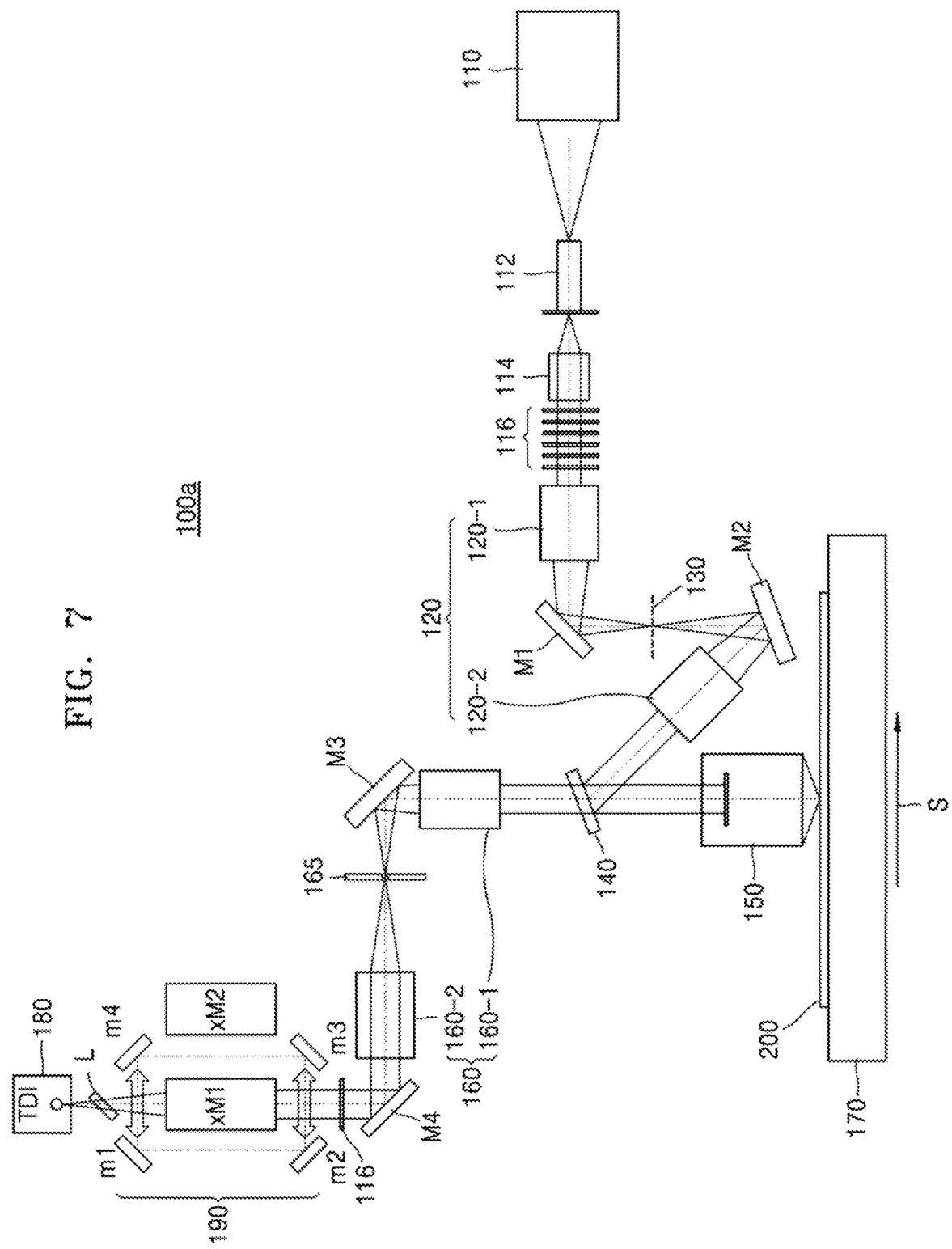
FIG. 7 is a conceptual diagram schematically illustrating an SI-based inspection apparatus according to an embodiment of the present disclosure.

FIG. 7 is a conceptual diagram schematically illustrating an SI-based inspection apparatus 100a according to embodiments of the present disclosure. Descriptions already given with reference to FIGS. 1 through 6C are briefly provided or omitted.

Referring to FIG. 7, the SI-based inspection apparatus 100a of the present embodiment may further include a magnification control optical system 190. In addition, the SI-based inspection apparatus 100a of the present embodiment may include a rod lens 112, a collimation lens 114, a plurality of filters 116, a diaphragm (or aperture) 165, and first through fourth mirrors M1 through M4.

The magnification control optical system 190 may also include first through fourth mirrors m1 through m4. The magnification control optical system 190 may change magnification of the SI-based inspection apparatus 100a through replacement of the first through fourth mirrors m1 through m4, or through a change of relative positions of the first through fourth mirrors m1 through m4. In FIG. 7, xM1 and xM2 which are written in the magnification control optical system 190 may indicate magnifications through the replacement. Although only two magnifications are illustrated, it may be possible to increase the number of magnifications to three or more according to various embodiments.

For reference, the plurality of filters 116 may include a spatial filter, a spectral filter, a neutral density (ND) filter, etc. In addition, according to an embodiment, the plurality of filters 116 may include a polarizing filter.

The SI-based inspection apparatus 100a of the present embodiment may also include the PSG 130 and the TDI camera 180 to solve the problems related to an SI-based inspection apparatus. For example, PSG 130 and the TDI camera 180, may contribute to resolving issues related to the inapplicability of a split optical system, usage of a light source of high illumination, slow inspection speed, required implementation of the post image processing, and corresponding lack of a real time inspection capability, etc.

Figure 8:
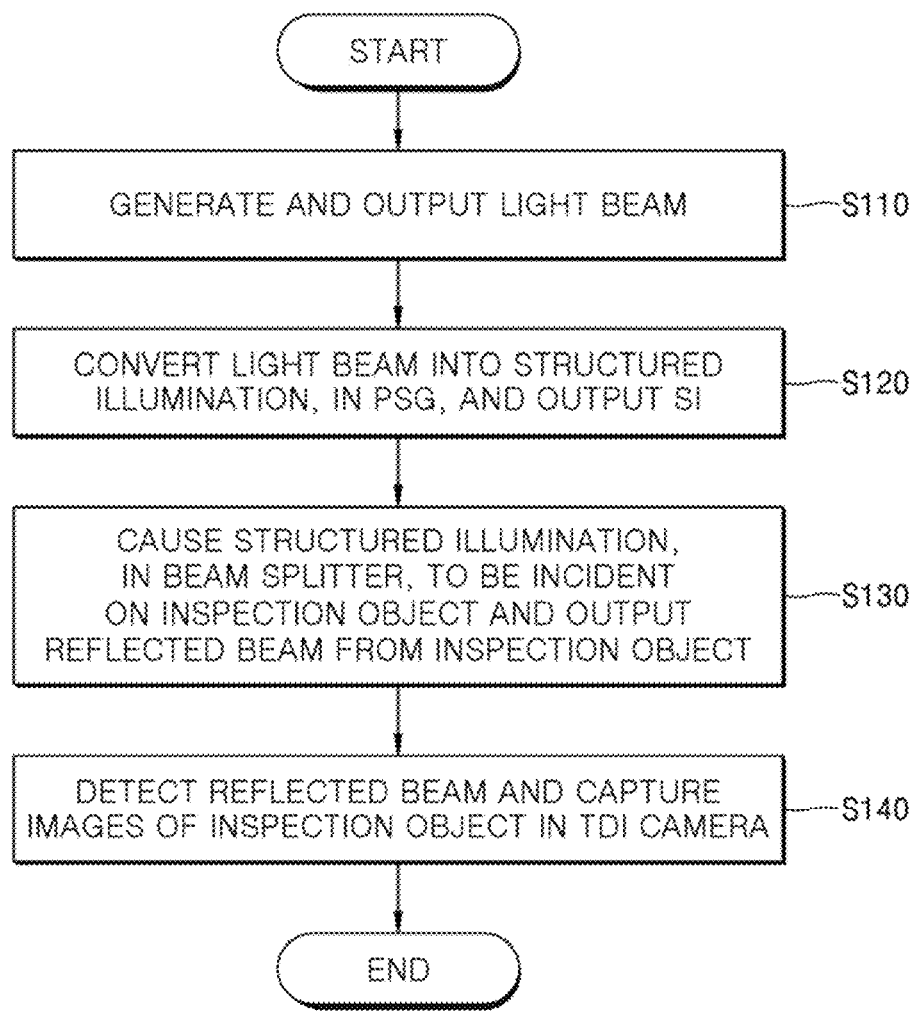
FIG. 8 is a flowchart of an SI-based inspection method according to an embodiment of the present disclosure.

FIG. 8 is a flowchart of an SI-based inspection method according to embodiments of the present disclosure. FIG. 8 is described together with FIG. 1, and description already given with reference to FIGS. 1 through 7 are briefly provided or omitted.

Referring to FIG. 8, the SI-based inspection method of the present embodiment may first generate and emit a light beam from the light source 110 (S110). The light beam from the light source 110 may be, for example, an LPP laser light source. However, the light beam from the light source 110 is not limited to a pulse laser.

Next, the PSG 130 may convert the light beam of the light source 110 into the SI, and may then emit the SI (S120). For example, the light beam of the light source 110 may be converted into the SI characterized by dipole illumination or quadrupole illumination as the light beam of the light source 110 passes through the PSG 130. The PSG 130 may have a structure in which the first region (refer to A1 in FIG. 3A) of a thin layer and the second region (refer to A2 in FIG. 3A) of a thick layer are arranged in a line-and-space shape, a checkered shape, or a mesh shape. In addition, since the PSG 130 may not include a metal such as chromium, the PSG 130 may pass substantially all of the light of an incident beam. In other words, both the first region A1 and the second region A2 of the PSG 130 may include transparent materials such as quartz without chromium.

The PSG 130 may have a form capable of generating an appropriate SI corresponding to the shape of a pattern formed on the inspection object 200. For example, when a line-and-space shape is included on the inspection object 200, the PSG 130 may have the line-and-space shape as in the PSG 130a of FIG. 2B. Additionally or alternatively, when a checkered shape or a mesh shape is included on the inspection object 200, the PSG 130 may also have a checkered shape or a mesh shape like the PSGs (130b, 130c, and 130d) in FIGS. 2C through 2E. To improve resolution, the pitch of the patterns which are formed by the first region A1 and the second region A2 of the PSG 130 may be designed based on conditions of the optical system in the inspection apparatus 100.

Next, the SI from the PSG 130 may be incident on the inspection object 200 by the beam splitter 140, and the reflected light beam from the inspection object 200 may be output toward the TDI camera 180 (S130) by the beam splitter 140. For example, the beam splitter 140 may transmit or reflect the SI that is incident from the PSG 130 to be incident on the inspection object 200, and may reflect or transmit the reflected beam from the inspection object 200 toward the TDI camera 180.

The TDI camera 180 may capture images of the inspection object 200 by detecting the reflected light beam emitted from the beam splitter 140 (S140). The capturing of images of the inspection object 200 by the TDI camera 180 may be performed in synchronization with a movement of the inspection object 200 in the scanning direction S by the stage 170, and a movement of the FOV of the TDI camera 180. As described above, the TDI camera 180 may integrate a plurality of images of the inspection object 200 by accumulating and averaging the phases of the images. Accordingly, the SI-based inspection method of the present embodiment may avoid the necessity of post image processing process using Fourier transform and/or Fourier inverse transform based on the phase of each of the images.

Figure 9:
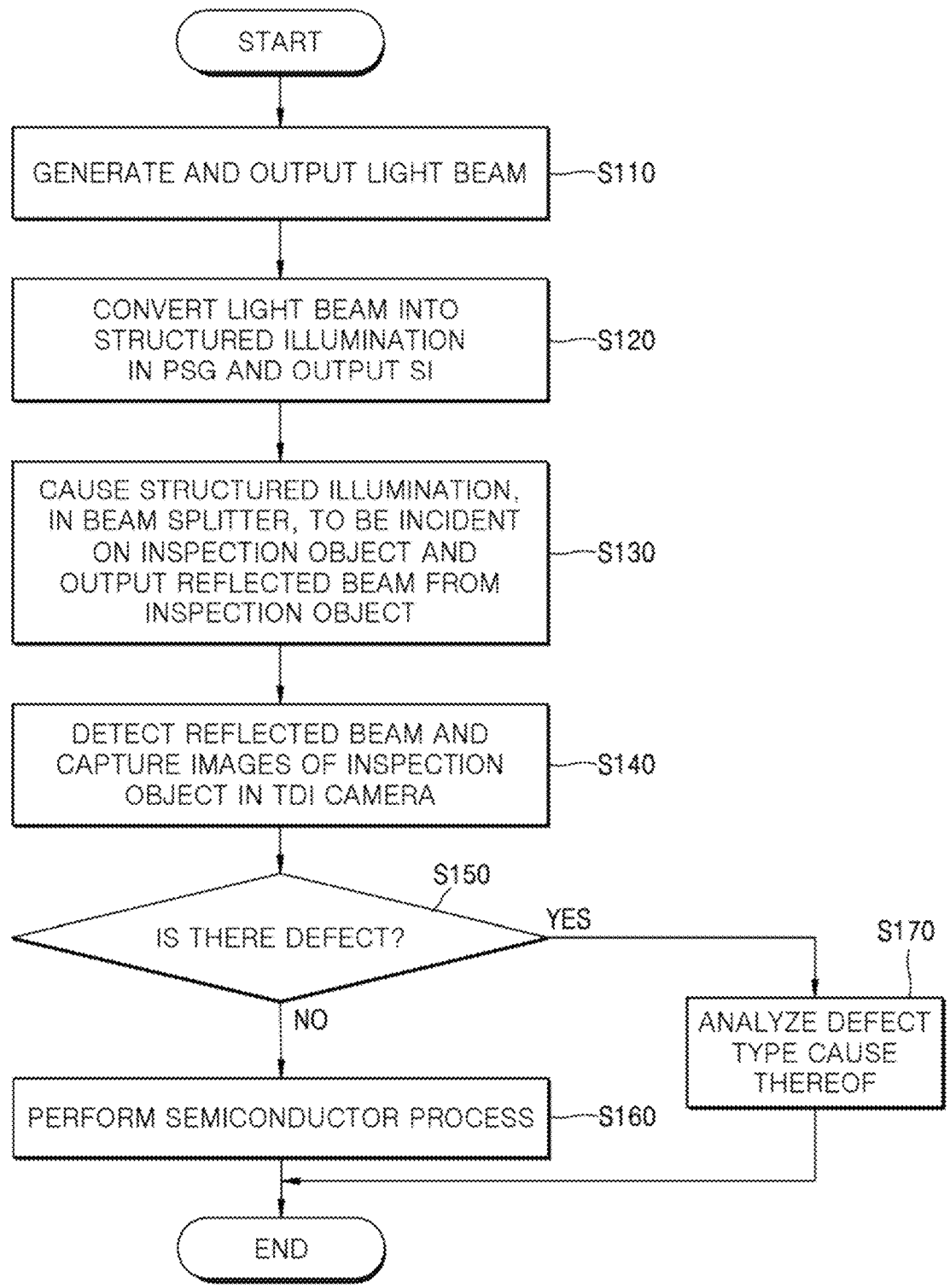
FIG. 9 is a flowchart of a semiconductor fabrication method including an SI-based inspection method according to an embodiment of the present disclosure.

FIG. 9 is a flowchart of a semiconductor fabrication method including the SI-based inspection method according to embodiments of the present disclosure. FIG. 9 is described with reference to components described above (e.g., with reference to FIG. 1). Descriptions already given with reference to FIG. 8 are briefly provided or omitted.

Referring to FIG. 9, the semiconductor device fabrication method of the present embodiment may proceed from the operation S110 of generating and emitting the light beam to the operation S140 of capturing images of the inspection object 200. The contents of the above operations are as described with reference to FIG. 8.

Next, it is determined whether defects exist in the inspection object 200 (S150). Whether the defects exist in the inspection object 200 may be determined based on the images captured by the TDI camera 180. For example, whether the defects exist in the inspection object 200 may be determined by determining whether fine particles or scratches exist on the inspection object 200 based on the images captured by the TDI camera 180. However, as described above, not all particles or scratches may be identified as defects. For example, only particles or scratches of sizes out of tolerance (i.e., greater than a threshold size) may be identified as defects.

When no defects are identified in the operation S150 (No), a semiconductor process may be performed on the inspection object 200 (S160). For example, when the inspection object 200 is a wafer, the semiconductor process for the wafer may be performed. The semiconductor process for the wafer may include various sub-processes. For example, the semiconductor process for the wafer may include a deposition process, an etching process, an ionization process, a cleaning process, etc. The semiconductor process for the wafer may result in the formation of integrated circuits and wirings required for the corresponding semiconductor device. The semiconductor process for the wafer may also include a test process on the semiconductor device at the wafer level.

After the semiconductor chips in the wafer are completed through the semiconductor process for the wafer, the wafer may be individualized into respective semiconductor chips. Individualization into respective semiconductor chips may be achieved through a sawing process by using a blade or a laser. Next, a packaging process may be performed on the semiconductor chip. The packaging process may refer to a process in which semiconductor chips are mounted on a printed circuit board (PCB) and sealed with a sealing material. The packaging process may include forming a stacked package by stacking a plurality of semiconductors on the PCB, or forming a package on package (POP) structure by stacking stack packages on a stack package. The semiconductor device or the semiconductor package may be completed through the packaging process of the semiconductor chip. The test process may be performed on the semiconductor package after the packaging process.

When it is determined that defects exist in the inspection object 200 during the operation S150 (Yes), types and causes of the defects may be analyzed (S170). According to embodiments of the present disclosure, a process of removing the defects by cleaning, or of discarding the corresponding inspection object, may be performed depending on the types of defects.

The SI-based inspection apparatus, according to embodiments of the present disclosure, may reduce loss of light while improving the resolution of inspection images by generating the SI through the PSG and using the SI for capturing images of the inspection object. Accordingly, the SI-based inspection apparatus may utilize a light source of relatively low illuminance while still obtaining high-resolution images of the inspection object to accurately inspect the defects of the inspection object.

In addition, the SI-based inspection apparatus described herein may perform high-speed photographing of the inspection object by capturing the images for the inspection object using a TDI camera, and, since the post image processing operation that integrates the images in consideration of phases of the images is unnecessary, may inspect the inspection object at a high speed in real time.

Furthermore, embodiments of the SI-based inspection apparatus of the present disclosure may be easily applied to a BF system having a split optical system structure in which the illumination optical system and the imaging optical system are separated by arranging the PSG only on the illumination optical system.

While the inventive concepts has been particularly shown and described with reference to example embodiments thereof, it will be understood by one of ordinary skill in the art that various changes in form and details may be made therein without departing from the spirit and scope of the inventive concept as defined by the following claims. Accordingly, the true scope of protection of the inventive concept should be determined by the claims.

What is claimed is:

1. An inspection apparatus based on structured illumination (SI), the inspection apparatus comprising:
a light source configured to generate and output a light beam;
a phase shift grating (PSG) configured to convert the light beam from the light source into the SI, the PSG comprising a checkered shape or a mesh shape;
a beam splitter configured to cause the SI to be incident on an inspection object and to output a reflected beam from the inspection object;
a stage configured to receive and move the inspection object; and
a time-delayed integration (TDI) camera configured to capture images of the inspection object by detecting the reflected beam,
wherein:
the PSG comprises a chromeless PSG and is configured to transmit substantially all of the light beam,
the PSG comprises a first region of a first thickness and a second region of a second thickness greater than the first thickness,
the PSG is configured to modify phases of the light beam such that phases of a first portion of the light beam passing through the first region are different from phases of a second portion of the light beam passing through the second region,
the PSG has an orthogonal structure in which the first region and the second region are alternately arranged in a first direction and a second direction perpendicular to the first direction,
the SI is quadrupole illumination based on the orthogonal structure, and the first region and the second region comprise the checkered shape, and when the SI is comprised in a rectangle, four illumination poles are formed adjacent to each side or adjacent to each vertex of the rectangle.

2. The inspection apparatus of claim 1, wherein the reflected beam is detected by the TDI camera without passing through a grating.

3. The inspection apparatus of claim 1, wherein the TDI camera is configured to photograph the inspection object while the inspection object is being moved in a first direction due to a movement of the stage in the first direction.

4. The inspection apparatus of claim 3, wherein the inspection apparatus is configured to integrate images of the inspection object captured by the TDI camera by accumulating and averaging phases of the images in synchronization with the movement of the stage and a relative position of the inspection object with respect to gratings of the PSG.

5. The inspection apparatus of claim 3, wherein the inspection apparatus is configured to inspect the inspection object in real time while images thereof are being captured in by the TDI camera.

6. An inspection apparatus based on structured illumination (SI), the inspection apparatus comprising:
a light source configured to generate and output a light beam;
a phase shift grating (PSG) configured to convert the light beam from the light source into the SI, the PSG comprising a checkered shape or a mesh shape;
a beam splitter configured to cause the SI to be incident on an inspection object and to output a reflected beam from the inspection object;
a stage configured to receive and move the inspection object; and
a time-delayed integration (TDI) camera configured to capture images of the inspection object by detecting the reflected beam,
wherein:
the PSG comprises a chromeless PSG and is configured to transmit substantially all of the light beam,
the PSG comprises a first region of a first thickness and a second region of a second thickness greater than the first thickness,
the PSG is configured to modify phases of the light beam such that phases of a first portion of the light beam passing through the first region are different from phases of a second portion of the light beam passing through the second region,
the PSG has an orthogonal structure in which the first region and the second region are alternately arranged in a first direction and a second direction perpendicular to the first direction,
the SI is quadrupole illumination based on the orthogonal structure,
the first region and the second region comprise the mesh shape, and
the second region is arranged at knot positions of the mesh shape.

7. An inspection apparatus based on structured illumination (SI), the inspection apparatus comprising:
a light source configured to generate and output a light beam;
a phase shift grating (PSG) configured to transmit substantially all of the light beam from the light source and to generate the SI;
a beam splitter configured to cause the SI to be incident on an inspection object and to output a reflected beam from the inspection object;
a stage configured to receive and move the inspection object; and
a time-delayed integration (TDI) camera configured to detect the reflected beam and to capture images of the inspection object,
wherein, the inspection apparatus is configured to inspect the inspection object in real time by capturing images of the inspection object using the TDI camera while the inspection object is being moved and integrating the images together by accumulating and averaging phases of the images without using a Fourier transform or an additional post-processing process.

8. The inspection apparatus of claim 7, wherein the PSG does not comprise chromium and comprises a first region of a first thickness and a second region of a second thickness greater than the first thickness.

9. The inspection apparatus of claim 8, wherein
the PSG comprises a line-and-space structure in which the first region and the second region are alternately arranged in a line shape, or
an orthogonal structure in which the first region and the second region are alternately arranged in a first direction and in a second direction perpendicular to the first direction.

10. The inspection apparatus of claim 8, wherein the SI is dipole illumination or quadrupole illumination.

11. The inspection apparatus of claim 7, wherein
the PSG is arranged between the light source and the beam splitter, and
a path from the inspection object to the TDI camera does not pass through a grating.

12. The inspection apparatus of claim 7, wherein
the inspection apparatus is configured to capture images of the inspection object using the TDI camera while the inspection object is being moved in a first direction by a movement of the stage in the first direction, and
the inspection apparatus is further configured to integrate images of the inspection object captured by the TDI camera by accumulating and averaging phases of the images in synchronization with the movement of the stage and a relative position of the inspection object with respect to gratings of the PSG.

* * * * *